(12) United States Patent
Lin et al.

(10) Patent No.: US 12,376,329 B2
(45) Date of Patent: Jul. 29, 2025

(54) SEMICONDUCTOR DEVICES HAVING A DIELECTRIC EMBEDDED IN SOURCE AND/OR DRAIN

(71) Applicant: Taiwan Semiconductor Manufacturing Company, Ltd., Hsinchu (TW)

(72) Inventors: Meng-Han Lin, Hsinchu (TW); Chia-En Huang, Xinfeng (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1007 days.

(21) Appl. No.: 17/458,726

(22) Filed: Aug. 27, 2021

(65) Prior Publication Data

US 2022/0293788 A1  Sep. 15, 2022

Related U.S. Application Data

(60) Provisional application No. 63/160,033, filed on Mar. 12, 2021.

(51) Int. Cl.
*H10D 30/69* (2025.01)
*H10B 51/20* (2023.01)
*H10D 30/63* (2025.01)
*H10D 64/01* (2025.01)

(52) U.S. Cl.
CPC ............. *H10D 30/63* (2025.01); *H10B 51/20* (2023.02); *H10D 64/017* (2025.01); *H10D 64/033* (2025.01)

(58) Field of Classification Search
None
See application file for complete search history.

(56) References Cited

U.S. PATENT DOCUMENTS

2019/0333930 A1\* 10/2019 Borukhov ........... H01L 29/1037

\* cited by examiner

*Primary Examiner* — Steven B Gauthier
*Assistant Examiner* — Lamont B Koo
(74) *Attorney, Agent, or Firm* — FOLEY & LARDNER LLP

(57) ABSTRACT

A semiconductor device, comprises a source structure comprising an active source portion, an inactive source portion spaced apart from the active source portion in a vertical direction, and a first dielectric structure interposed between the active source portion and the inactive source portion. A drain structure is spaced apart from the source structure in a first direction. A channel layer is disposed on outer surfaces of the source and the drain structures. A memory layer is disposed on an outer surface of the channel layer so as to wrap around the channel layer. At least one gate layer is in electrical communication with the active source portion.

20 Claims, 38 Drawing Sheets

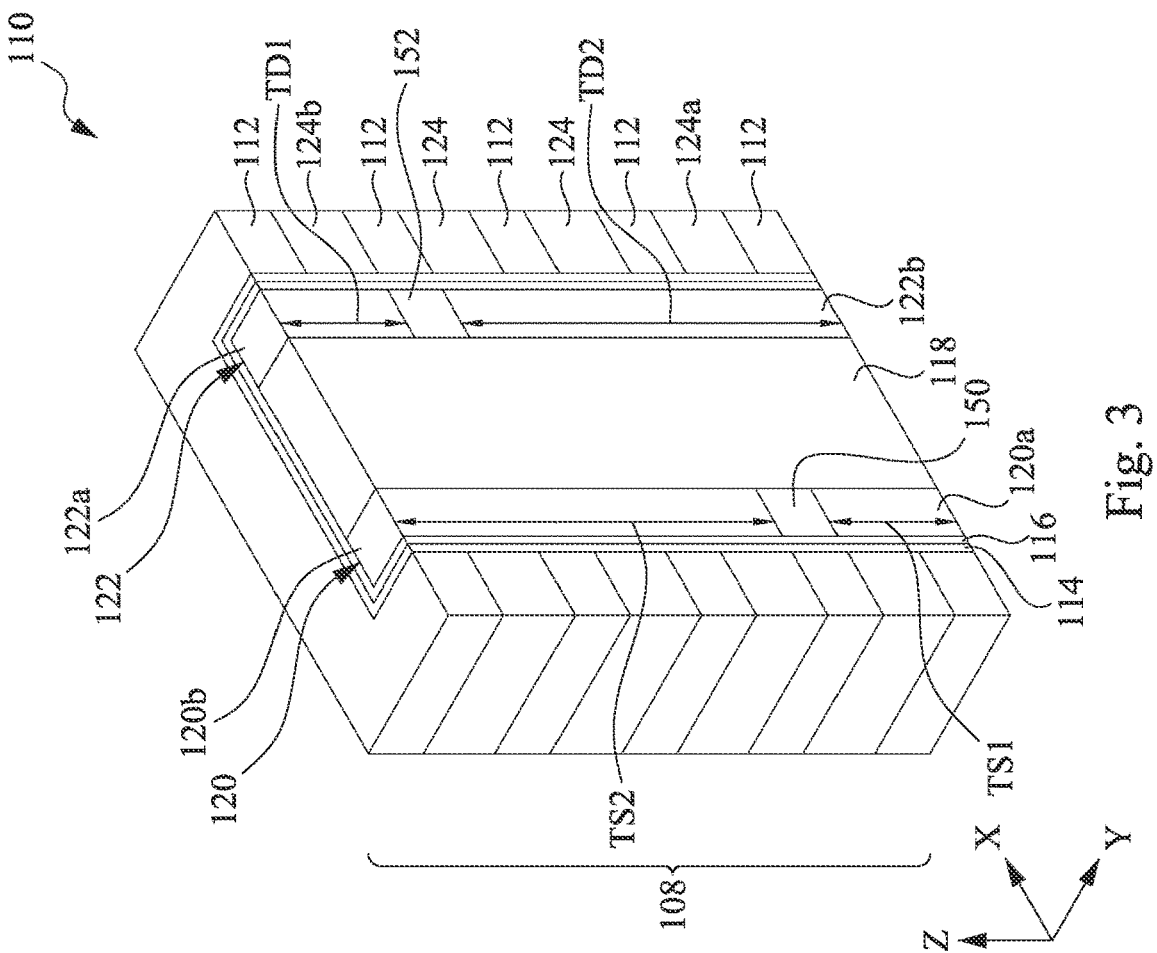
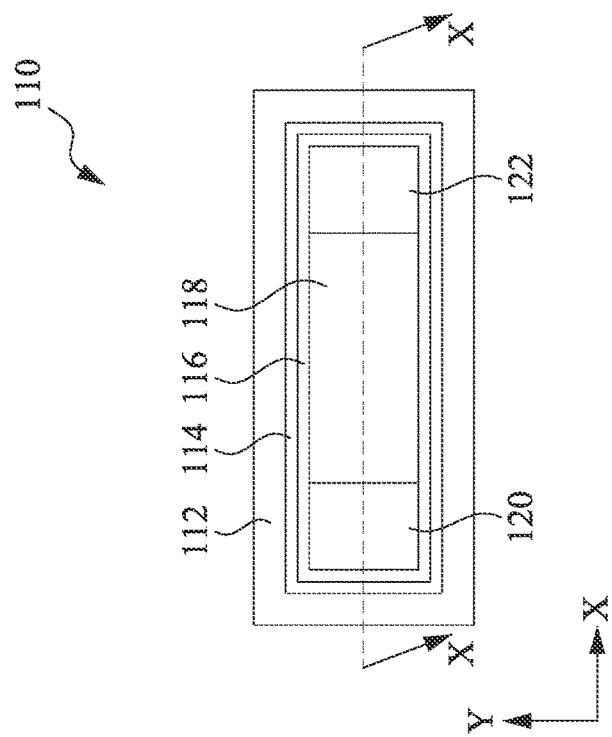

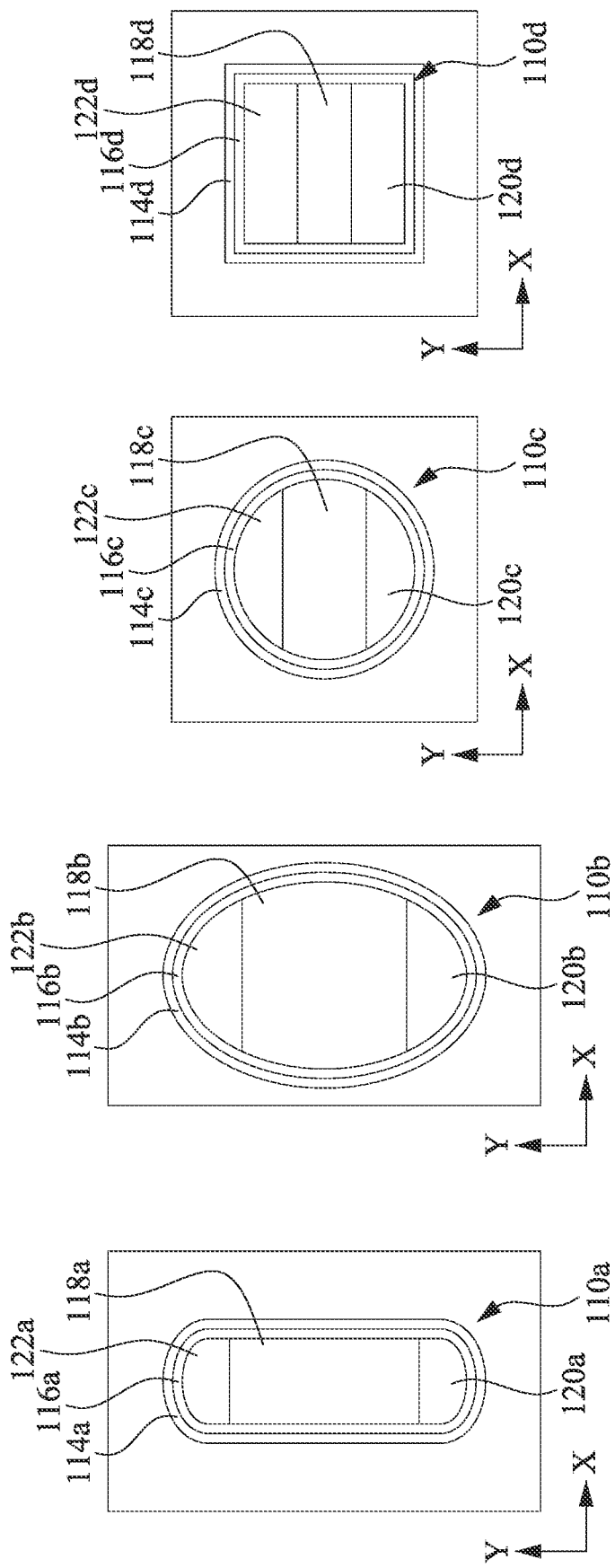

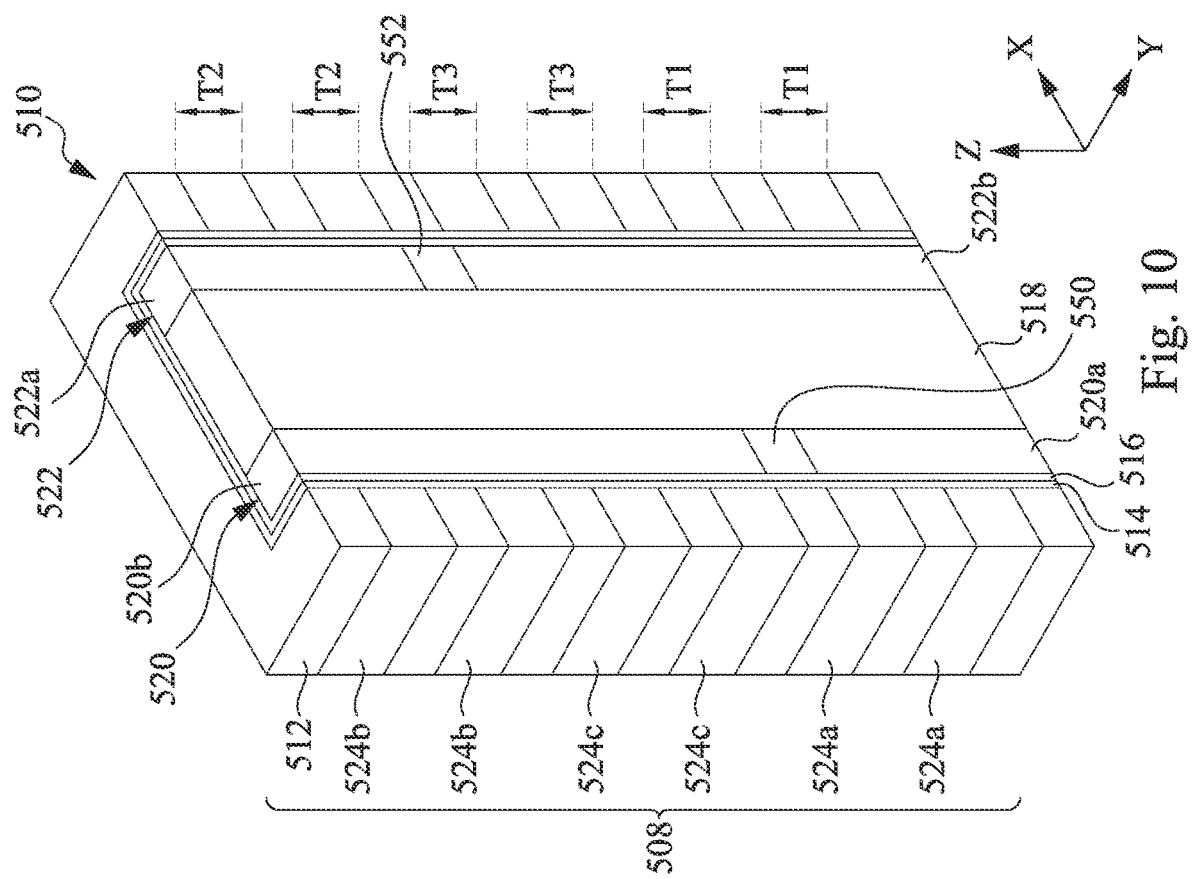
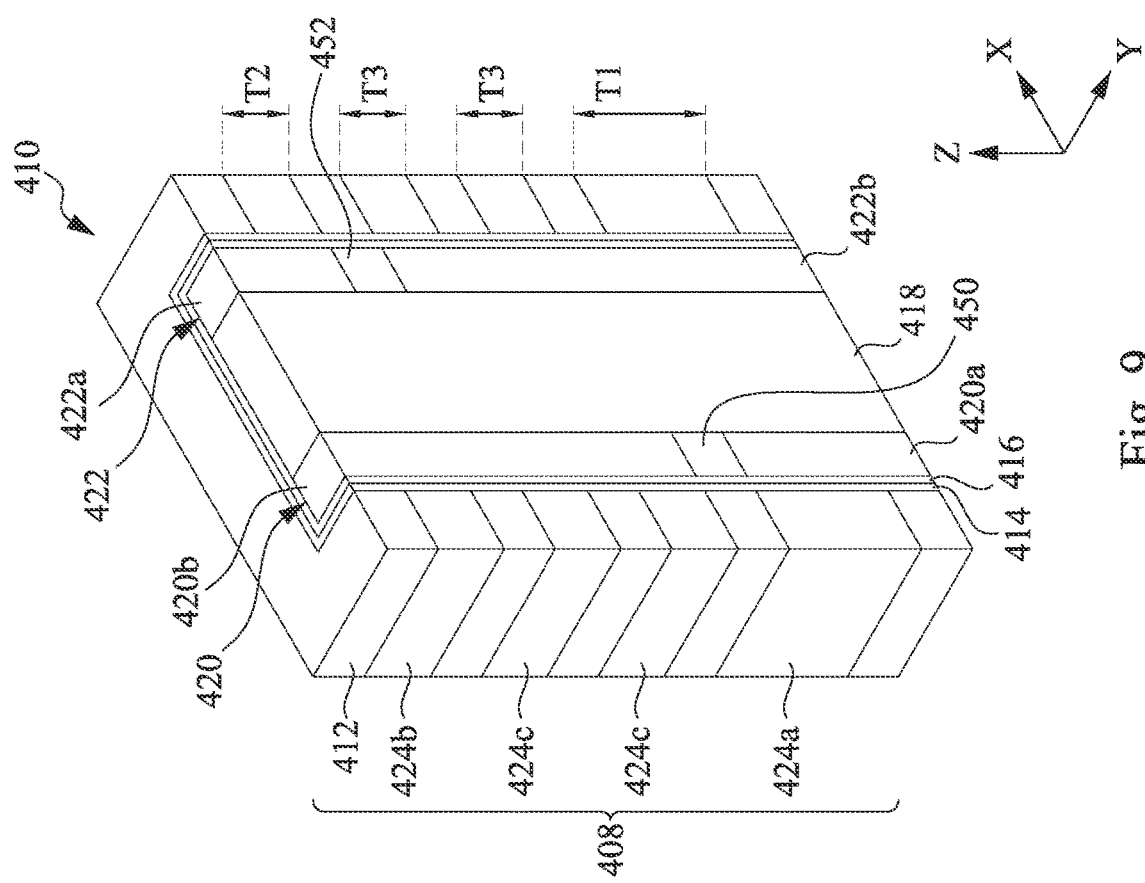
Fig. 10
Fig. 9

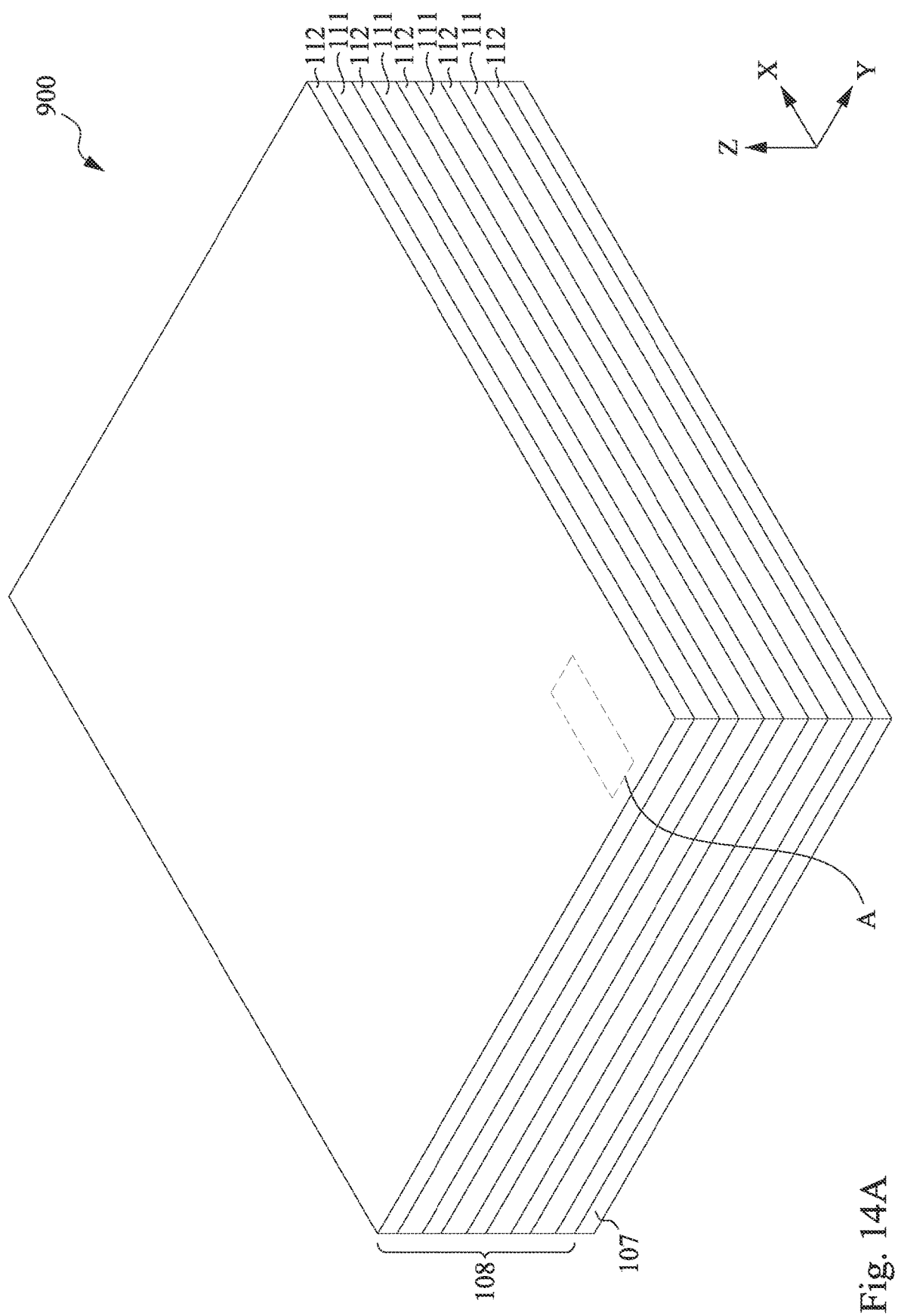

SEMICONDUCTOR DEVICES HAVING A DIELECTRIC EMBEDDED IN SOURCE AND/OR DRAIN

CROSS-REFERENCE TO RELATED APPLICATIONS

The present application claims priority to and benefit of U.S. Provisional Application No. 63/160,033, filed Mar. 12, 2021, the entire disclosure of which is hereby incorporated herein by reference.

BACKGROUND

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a top view of one semiconductor device of the array semiconductor devices included in the semiconductor die, according to an embodiment.

FIG. 3 is a side cross-section view of the semiconductor device of FIG. 2 taken along the line X-X in FIG. 2.

FIGS. 6A-6D are top views of various semiconductor devices having different shapes, according to some embodiments.

FIGS. 7, 8, 9, 10, 11, and 12 are side cross-section views of semiconductor devices, according to various embodiments.

FIGS. 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25, 26A, 26B, 27A, 27B and 28 illustrate various cross-sectional views of an example semiconductor device (or a portion of the example semiconductor device) during various fabrication stages, made by the method of FIGS. 13A-13B, in accordance with some embodiments.

DETAILED DESCRIPTION

Figure 1:
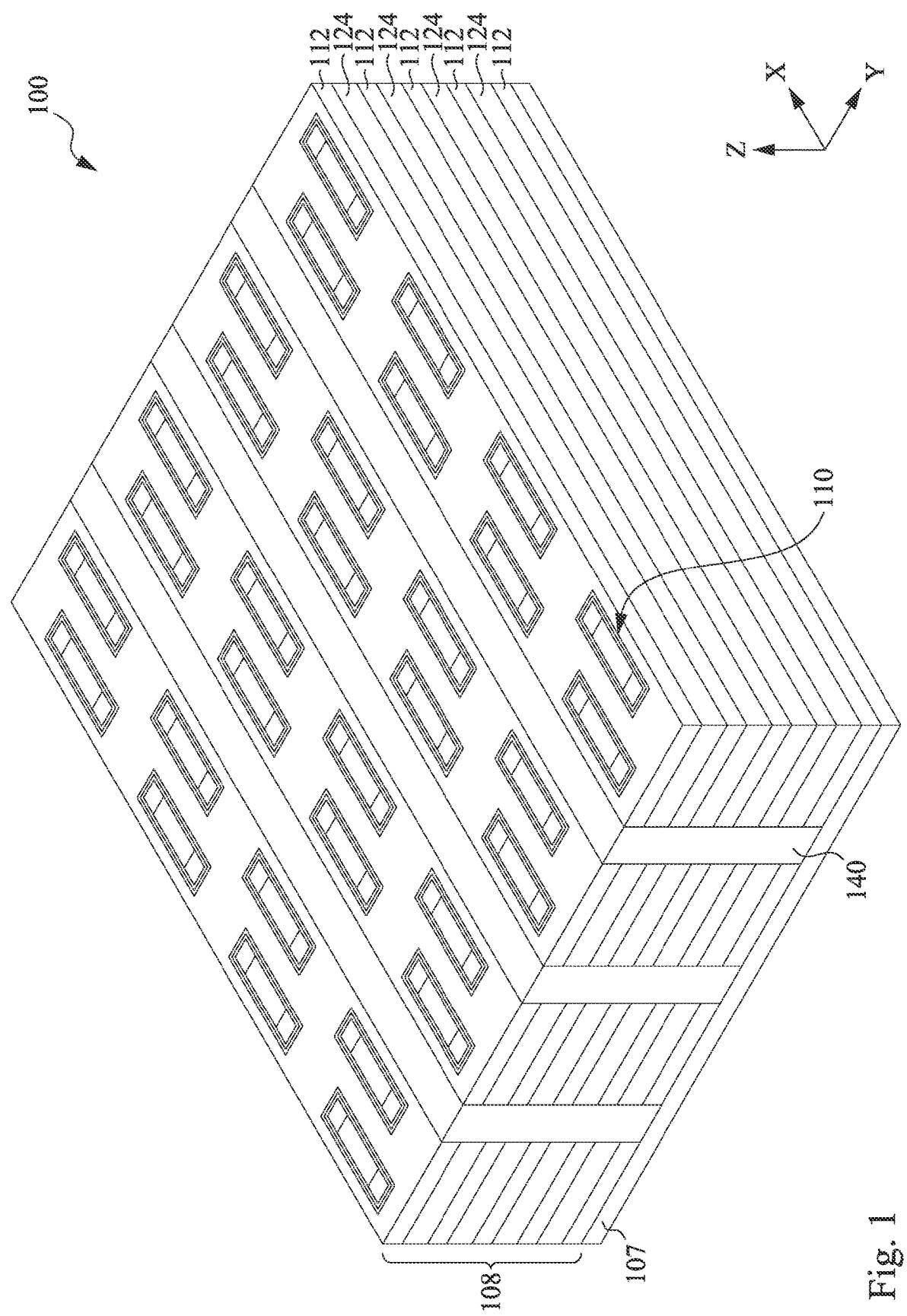
FIG. 1 is a top perspective view of a semiconductor die including an array of semiconductor devices, according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memories include an array of memory devices formed in a stack of insulating layers and gate layers, and may include a double gate. Such memory devices may include a source and a drain spaced apart from the source. A channel layer and a memory layer may wrap around the source and drain. In such memory devices, only a portion of the gate layers may be used to switch the memory between program mode (PGM) and erase mode (ESM), which causes charge to flow from the source to drain. However, since the entire length of the source and/or drain is electrically coupled to the area of the source drain located proximate to the gate layer that is used to activate the memory device, a high local source and/or drain capacitance to the gate layer through the memory film is experienced. This can increase source/drain resistive-capacitive delay, further slowing down read speed. The capacitance further increases as the number of gate layers included in the semiconductor device, which increases the thickness of the semiconductor device and correspondingly, the thickness of the source and drain.

Embodiments of the present disclosure are discussed in the context of forming a semiconductor die, and particularly in the context of forming 3D memory devices such as gate all around (GAA) memory devices, that are formed in a stack of insulating and gate layers. For example, the present disclosure provides semiconductor devices that include source structures and/or drain structures that have a dielectric structure embedded therein. The dielectric structure separates the source structure and/or drain structure into an active portion and an inactive portion that is electrically isolated from the active portion by the dielectric structure.

This significantly reduces the local source structure and drain structure capacitance improving read speed.

FIG. 1 illustrates a top perspective view of a semiconductor die 100 that includes an array of semiconductor devices 110 (e.g., memory devices), according to an embodiment. The semiconductor device includes a substrate 107 (e.g., a silicon, or silicon on insulator (SOI) substrate) on which the plurality of semiconductor devices 110 are disposed. The array of semiconductor devices 110 are arranged in a plurality of rows, each of which extend in a first direction (e.g., the X direction). Each semiconductor device 110 is separated and electrically isolated from an adjacent semiconductor device 110 within a row by a device spacer, which may be formed from an electrically insulating material f (e.g., silicon oxide ($SiO_2$), silicon nitride (SiN), silicon oxide (SiO), silicon carbide nitride (SiCN), silicon oxycarbonitride (SiOCN), silicon oxynitride (SiON), $HfO_2$, TaOx, TiOx, AlOx, etc.).

Referring also now to FIGS. 2-3, each semiconductor device 110 includes a source structure 120, a drain structure 122 spaced apart from the source structure 120 in a first direction (e.g., the X-direction), and an inner spacer 118 disposed between the source structure 120 and the drain structure 122. A channel layer 116 is disposed on outer surfaces of the source structure 120, the drain structure 122, and the inner spacer 118 such that the channel layer 116 is wrapped around the source structure 120, the drain structure 122, and the inner spacer 118. A memory layer 114 is disposed on an outer surface of the channel layer 116 so as to wrap around the channel layer 116. A stack 108 is disposed on outer surfaces of the memory layer 114 in the second direction, the stack comprising a plurality of insulating layers 112 and a plurality of gate layers 124 alternatively stacked on top of each other in a vertical direction (e.g., the Z-direction), and extending in the first direction (e.g., the X-direction).

The semiconductor device 110 may include at least one gate layer disposed on a radially outer surface of the memory layer 114, and extending in the first direction (e.g., the X-direction). For example, as shown in FIGS. 1 and 3, the stack 108 includes a plurality of gate layers 124 wrapped around the memory layer 114 of each semiconductor device 110 located in a row of semiconductor devices 110, the gate layers 124 extending in the first direction (e.g., the X-direction). As shown in FIG. 1, the stack 108 includes a plurality of insulating layers 112, and a plurality of gate layers 124 alternative stacked on top of one another in the vertical direction (e.g., the Z-direction). In some embodiments, a topmost layer and a bottommost layer of the stack 108 may include an insulating layer 112 of the plurality of insulating layers 112. The bottommost insulating layer 112 may be disposed on the substrate 107.

The insulating layer 112 may include silicon nitride (SiN), silicon oxide (SiO), $SiO_2$, silicon carbide nitride (SiCN), silicon oxycarbonitride (SiOCN), silicon oxynitride (SiON), HfO2, TaOx, TiOx, AlOx, etc. Moreover, the gate layer 124 may be formed from a conductive material such as a metal, for example, aluminum (Al), titanium (Ti), tungsten (W), copper (Cu), cobalt (Co), TiN, tantalum nitride (TaN), silver (Ag), gold (Au), nickel (Ni), chromium (Cr), hafnium (Hf), ruthenium (Ru), platinum (Pt), tungsten nitride (WN), etc., or a high-k dielectric material, for example, hafnium oxide (HfO), tantalum oxide ($TaO_x$), TiOx etc. In some embodiments, an adhesive layer may be disposed between the insulating layers 112, the memory layer 114, and the gate layers 124, so as to facilitate adhesion of the gate layers 124 to the corresponding insulating layers 112 and the memory layers 114. In some embodiments, the adhesive layer may include e.g., titanium (Ti), chromium (Cr), TiN, TaN, WN, or any other suitable adhesive material. While not shown, driver lines may be coupled to the source structure 120 and the drain structure 122 of the semiconductor devices 110, and may provide electric charge to the source structure 120 and the drain structure 122.

The channel layer 116 extends from a top surface of the semiconductor die 100 to the substrate 107 in a vertical direction (e.g., the Z-direction), and wraps around the source structure 120, the drain structure 122, and the inner spacer 118 of a corresponding semiconductor device 110. In some embodiments, the channel layer 116 may be formed from a semiconductor material, for example, Si (e.g., polysilicon or amorphous silicon), Ge, SiGe, silicon carbide (SiC), IGZO, ITO, ZnO, IWO, etc. and can be an n-type or p-type doped semiconductor. A memory layer 114 extends from a top surface of the semiconductor die 100 to the substrate 107 in a vertical direction (e.g., the Z-direction), and wraps around the outer surface of the channel layer 116. In some embodiments, the memory layer 114 may include a ferroelectric material, for example, lead zirconate titanate (PZT), PbZr/$TiO_3$, $BaTiO_3$, $PbTiO_3$, $HfO_2$, $Hr1-xZ_{rx}O_2$, $ZrO_2$, $TiO_2$, NiO, $TaO_x$, $Cu_2O$, $Nb_2O_5$, $AlO_x$, etc.

As shown in FIG. 3, a dielectric structure 150, 152 is embedded within the source structure 120 and the drain structure 122, respectively such that the dielectric structure 150, 152 divides the source structure 120 and the drain structure 122 into an active portion, and an inactive portion electrically isolated from the active portion. Expanding further, the source structure 120 comprises an active source portion 120a and an inactive source portion 120b spaced apart from the active source portion 120a in the vertical direction (e.g., the Z-direction). A first dielectric structure 150 is interposed between the active source portion 120a and the inactive source portion 120b. Similarly, the drain structure 122 comprises an active drain portion 122a and an inactive drain portion 122b spaced apart from the active drain portion 122a in the vertical direction (e.g., the Z-direction). A second dielectric structure 152 is interposed between the active drain portion 122a and the inactive drain portion 122b. The source structure 120 and the drain structure 122 extend from a top surface of the semiconductor die 100 to the substrate 107 in a vertical direction (e.g., the Z-direction).

The active source portion 120a is located proximate to a first surface (e.g., a bottom surface) of the semiconductor device 110 in the vertical direction, and the active drain portion 122a is located proximate to a second surface (e.g., a top surface) of the semiconductor device 110 in the vertical direction (e.g., the Z-direction) opposite the first surface. As shown in FIG. 3, only a bottommost gate layer 124a of the plurality of gate layers 124 is in electrical communication with the active source portion 120a of the source structure 120 through the memory layer 114 and the channel layer 116, while the inactive source portion 120b is electrically isolated from the bottommost gate layer 124a and the active source portion 120 because of the first dielectric structure 150 interposed therebetween. Similarly, only a topmost gate layer 124b of the plurality of gate layers 124 is in electrical communication with the active drain portion 122a of the drain structure 122 through the memory layer 114 and the channel layer 116, while the inactive drain portion 122b is electrically isolated from the topmost gate layer 124b and the active drain portion 122a because of the second dielectric structure 152 interposed therebetween.

The active source portion 120a has an active source portion thickness TS1 that is smaller than an inactive source portion thickness TS2 of the inactive source portion 120b. Moreover, an active drain portion thickness TD1 of the active drain portion 122a is smaller than an inactive drain portion thickness TD2 of the inactive drain portion 122b. In some embodiments, TS1 may be equal to TD1. In other embodiments, TS1 may be less than or greater than TD1. In some embodiments, TS1 and TD1 may be in a range of 10 nm to 200 nm, inclusive. However, other ranges and values are also contemplated and are also within the scope of this disclosure. In some embodiments, a ratio of TS1 to TS2, or TD1:TD2 maybe in a range of 1:10, 1:20, 1:40, 1:80, 1:100, 1:120, inclusive, or even higher. Other ranges and values are also contemplated and are within the scope of this disclosure.

Thus, different from semiconductor devices in which the capacitance of source and/or drain corresponds to an entire thickness of the source and the drain, the capacitance of the source structure 120 is limited to the active source portion 120a, and the capacitance of the drain structure 122 is limited to the active drain portion 122a. Thus, regardless of the thickness of the stack 108, the capacitance of the source structure 120 and the drain structure 122 is defined only by the much thinner active source portion 120a and the active drain portion 122a, which reduces the local capacitance of the source structure 120 and drain structure 122 and improves read speed.

Figure 4:
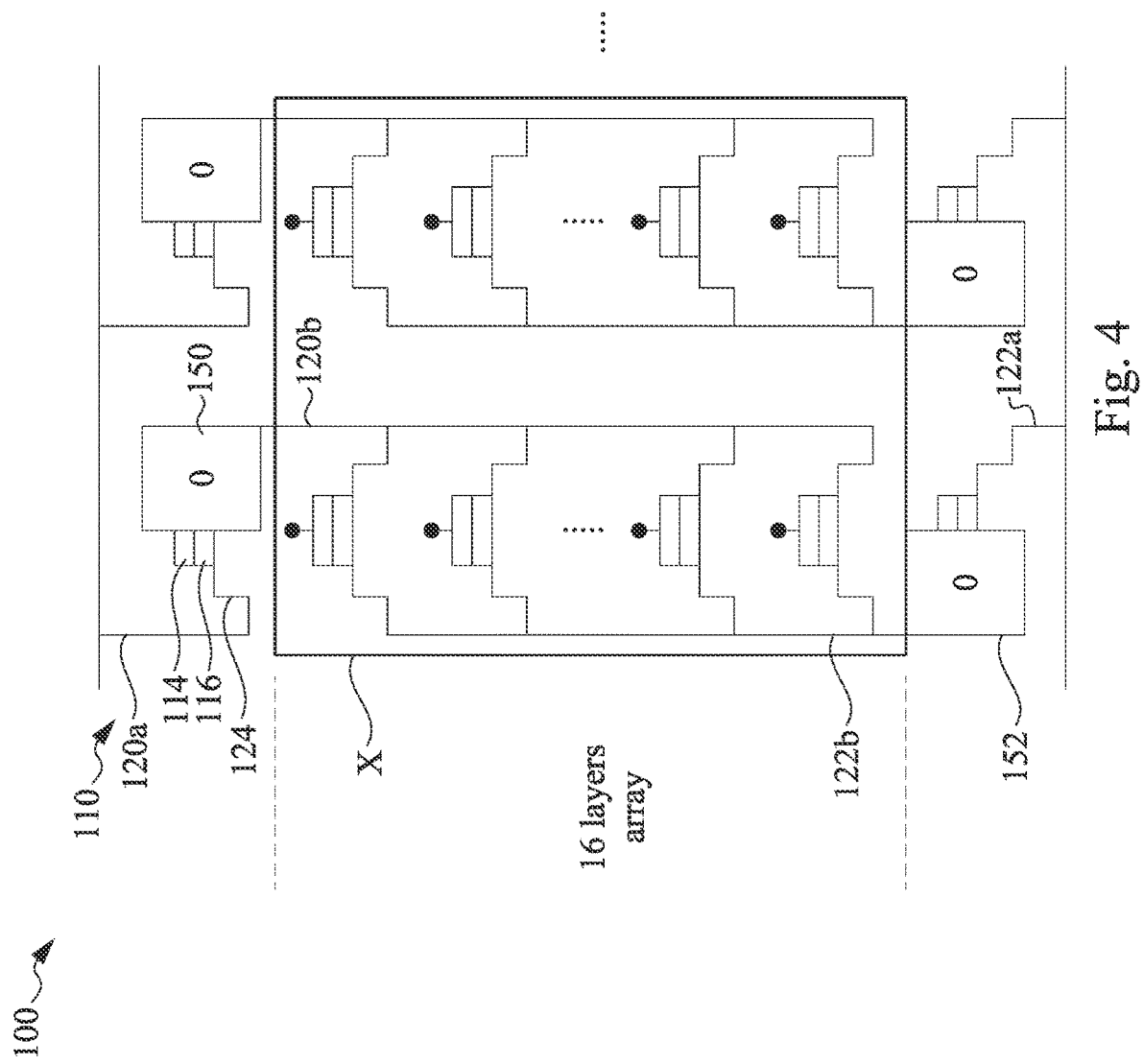
FIG. 4 is a circuit diagram depicting a semiconductor die including an array of semiconductor devices in which only a portion of the source structure includes an active portion of the source structure and only a portion of the drain structure includes an active portion of the drain structure, according to an embodiment.
Figure 5:
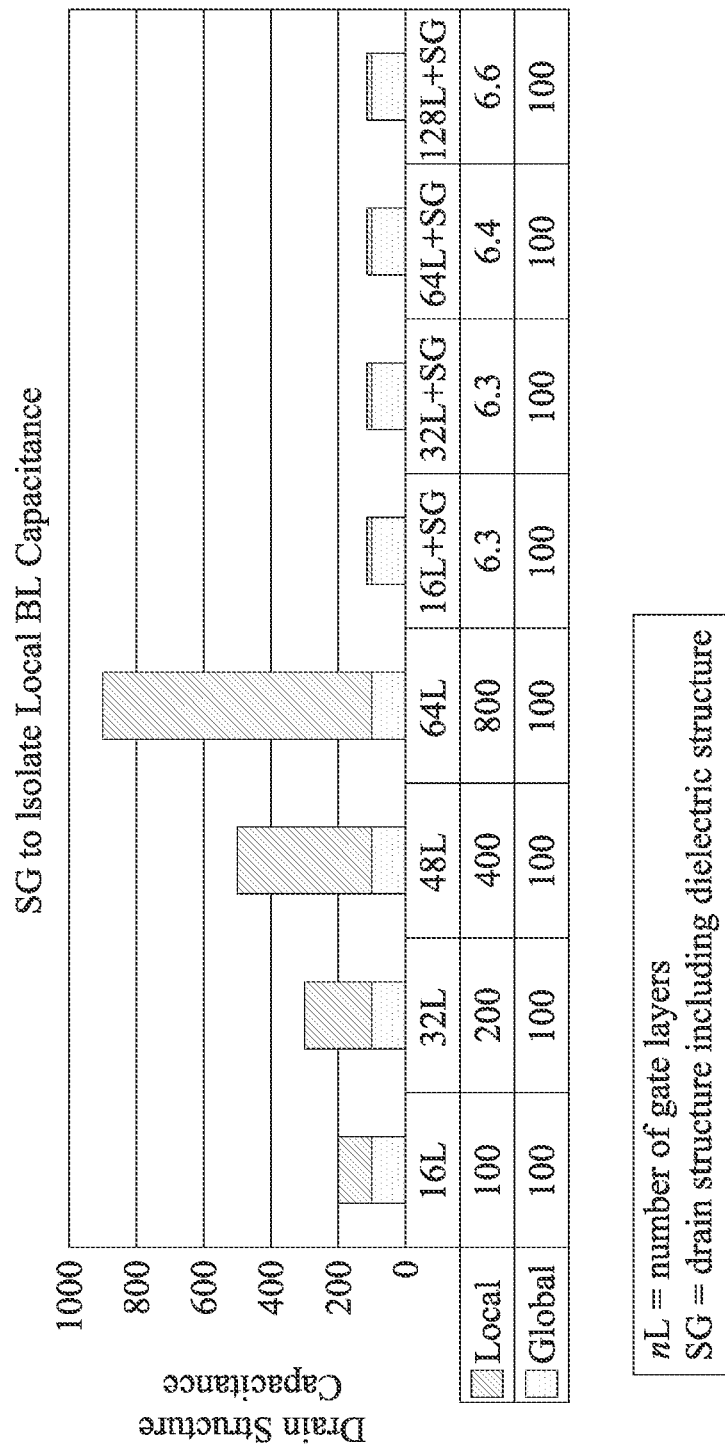
FIG. 5 is a bar chart showing the reduction in capacitance of a drain structure using only a portion of the drain structure as active drain portion, relative to a drain structure in which the entire height of the drain structure is active.

For example, FIG. 4 illustrates a simplified circuit diagram of the semiconductor die 100 including the array of semiconductor devices 110. The area X shows cells or areas within each semiconductor device 110, that correspond to unselected gate layers 124 that are not in contact with the active source portion 120a or the active drain portion 122a, thus inhibiting the capacitance of the inactive source portion 120b and the inactive drain portion 122b. FIG. 5 is a bar chart showing the reduction in capacitance of a drain structure using only a portion of the drain structure as active drain portion, relative to a drain structure in which the entire height of the drain structure is active. While the global capacitance of the drain structure remains constant at 100 micro Farad, without the dielectric structure embedded therein, the local capacitance of the drain structure increases as the number of gate layer, and therefore, a thickness of the semiconductor die and the drain structure increase. In contrast, by embedding the dielectric structure within the drain structure, the local capacitance remains below 10 micro Farad, and remains substantially constant even when the number of gate layers is increased from 16 layers to 128 layers.

In some embodiments, the active and inactive source portions 120a/b and the active and inactive drain portions 122a/b may include a conducting material, for example, metals such as Al, Ti, TiN, TaN, Co, Ag, Au, Cu, Ni, Cr, Hf, Ru, W, Pt, WN, Ru, any other suitable material or a combination or alloy thereof. In some embodiments, the active and inactive source portions 120a/b and the active and inactive drain portions 122a/b may include a semiconductor material, for example, an n or p-doped semiconductor such as Si, SiGe, or any other semiconductor material (e.g., IGZO, ITO, IWO, poly silicon, amorphous Si, etc.), and may be formed using a deposition process, an epitaxial growth process, or any other suitable process.

The first and second dielectric structure 150 and 152 includes a dielectric material SiN, $HfO_2$, $TaO_x$, $TiO_x$, $AlO_x$, etc. The dielectric structures 150 and 152 may be formed using a deposition process, an epitaxial growth process, or any other suitable process. The dielectric structures 150 and 152 may have a thickness in a range of 5 nm to 50 nm, inclusive. In some embodiments, a ratio of thickness of the first and/or second dielectric structures 150 and 152 to TS1 and/or TD1 may be in a range of 1:2 to 1:10, inclusive.

The inner spacer 118 extends from a top surface of the semiconductor die 100 to the substrate 107 in a vertical direction (e.g., the Z-direction), and extends from the source structure 120 to the drain structure 122 in the first direction (e.g. the X-direction). The inner spacer 118 may be formed from an insulating material, for example, silicon nitride (SiN), silicon oxide (SiO), $SiO_2$, silicon carbide nitride (SiCN), silicon oxycarbonitride (SiOCN), silicon oxynitride (SiON), HfO2, TaOx, TiOx, AlOx, etc. In some embodiments, inner spacer 118 and the insulating layers 112 may be formed from the same insulating materials.

FIGS. 1-2 show each semiconductor device 110 having a rectangular shape in the X-Y plane. In other embodiments, the semiconductor device 110 may have any suitable shape. For example, FIG. 6A shows a semiconductor device 110a having a memory layer 114a, a channel layer 116a, a source 120a and a drain 122a spaced apart from the source 120a by an inner spacer 118a. The semiconductor device 110a has a rectangular shape in the X-Y plane such that the axial ends of the semiconductor device 110a are rounded.

FIG. 6B shows a semiconductor device 110b having a memory layer 114b, a channel layer 116b, a source 120b and a drain 122b spaced apart from the source 120b by an inner spacer 118b. The semiconductor device 110b has an oval or elliptical shape in the X-Y plane. FIG. 6C shows a semiconductor device 110c having a memory layer 114c, a channel layer 116c, a source 120c and a drain 122c spaced apart from the source 120c by an inner spacer 118c. The semiconductor device 110c has a circular shape in the X-Y plane. FIG. 6D shows a semiconductor device 110d having a memory layer 114d, a channel layer 116d, a source 120d and a drain 122d spaced apart from the source 120d by an inner spacer 118d. The semiconductor device 110d has a square shape in the X-Y plane.

Figure 7:
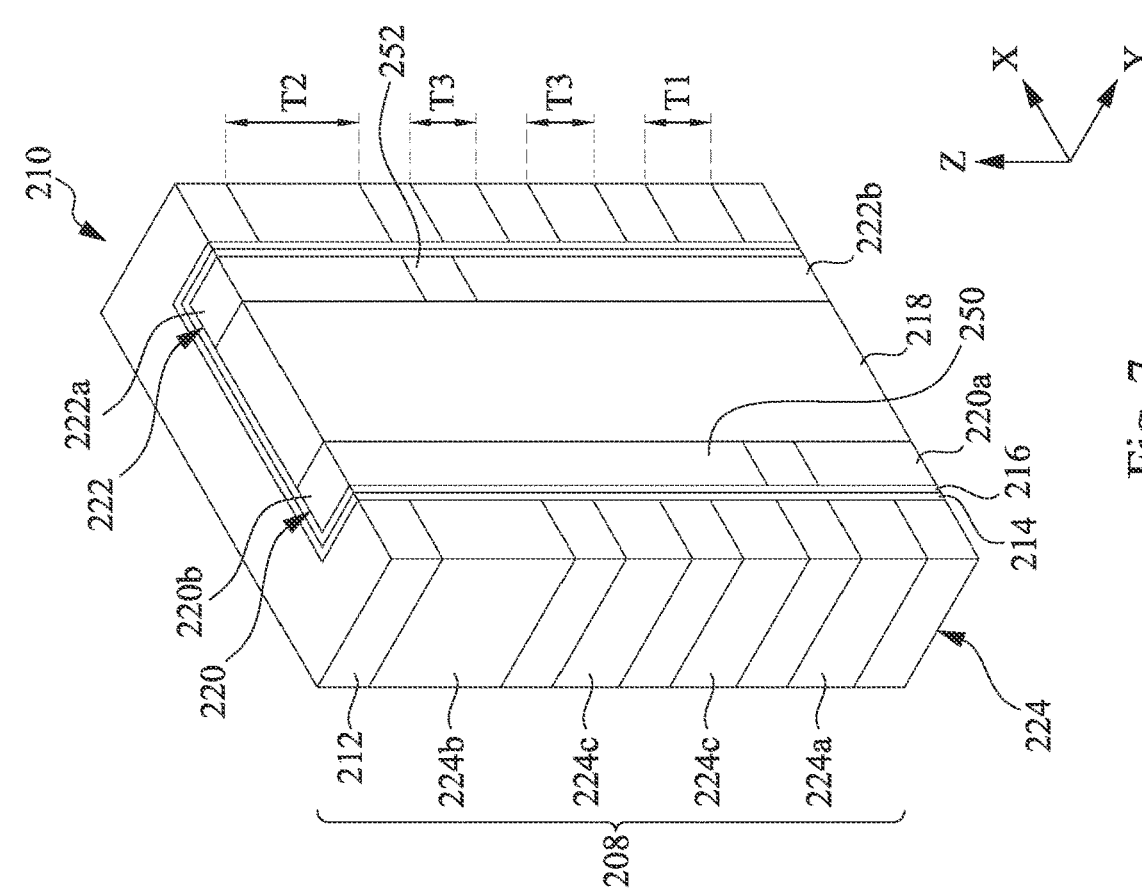

While the semiconductor device 110 described with respect to FIGS. 1-3 included a plurality of gate layers 124 each having about the same thickness, in some embodiments, a thickness of the gate layers corresponding to the active source portion and/or the active drain portion may be thicker than a thickness of the gate layers associated with the inactive source portion and/or the inactive drain portion. In some embodiments, a thickness of the gate layers corresponding to each of the active source portion and the active drain portion may be thicker than a thickness of the gate layers associated with the inactive source portion and/or the inactive drain portion. For example, FIG. 7 is a side cross-section view of a semiconductor device 210 (e.g., a memory device), according to an embodiment. The semiconductor device 210 includes a stack 208 including a plurality of gate layers 224 and a plurality of insulating layers 212 alternatively stacked on top of each other. The semiconductor device 210 includes a source structure 220 and a drain structure 222 separated from the source structure 220 by an inner spacer 218, as described with respect to the semiconductor device 110. A channel layer 216 is wrapped around the source structure 220, the inner spacer 218, and the drain structure 222, and a memory layer 214 is wrapped around the channel layer 216. The stack 208 is wrapped around the memory layer 214.

The source structure 220 includes an active source portion 220a, an inactive source portion 220b, and a first dielectric structure 250 interposed therebetween. The active source structure 220 is located proximate to a bottom surface of the semiconductor device 210. Similarly, the drain structure 222 includes an active drain portion 222a, an inactive drain portion 222b, and a second dielectric structure 252 interposed therebetween. The active drain portion 222a is located proximate to a topmost surface of the semiconductor device 210. A first gate layer 224a which is a bottommost gate layer is in electrical communication with the active source portion 220a, and the second gate layer 224b which is a topmost gate layer is in electrical communication with the active drain portion 222a. Third gate layers 224c are disposed between the first and second gate layers 224a and 224b. In some embodiments, the second thickness T2 is different from the first thickness T1. In some embodiments, the first thickness T1 of the first gate layer 224a is about the same as a third thickness T3 of the third gate layers 224c. In some embodiments, however, the second thickness T2 of the second gate layer 224b is larger than the first thickness T1 and the third thickness T3. In some embodiments, the first thickness T1 and the second thickness T2 may be in a range of 10 nm to 100 nm, inclusive, but other ranges and values are also contemplated and are within the scope of this disclosure. In some embodiments, a ratio of the first or second thickness T1 or T2 to the third thickness T3 (T1/T2:T3) may be in a range of 1:1 to 1:5, inclusive, but other ranges and values are also contemplated and are within the scope of this disclosure.

Figure 8:
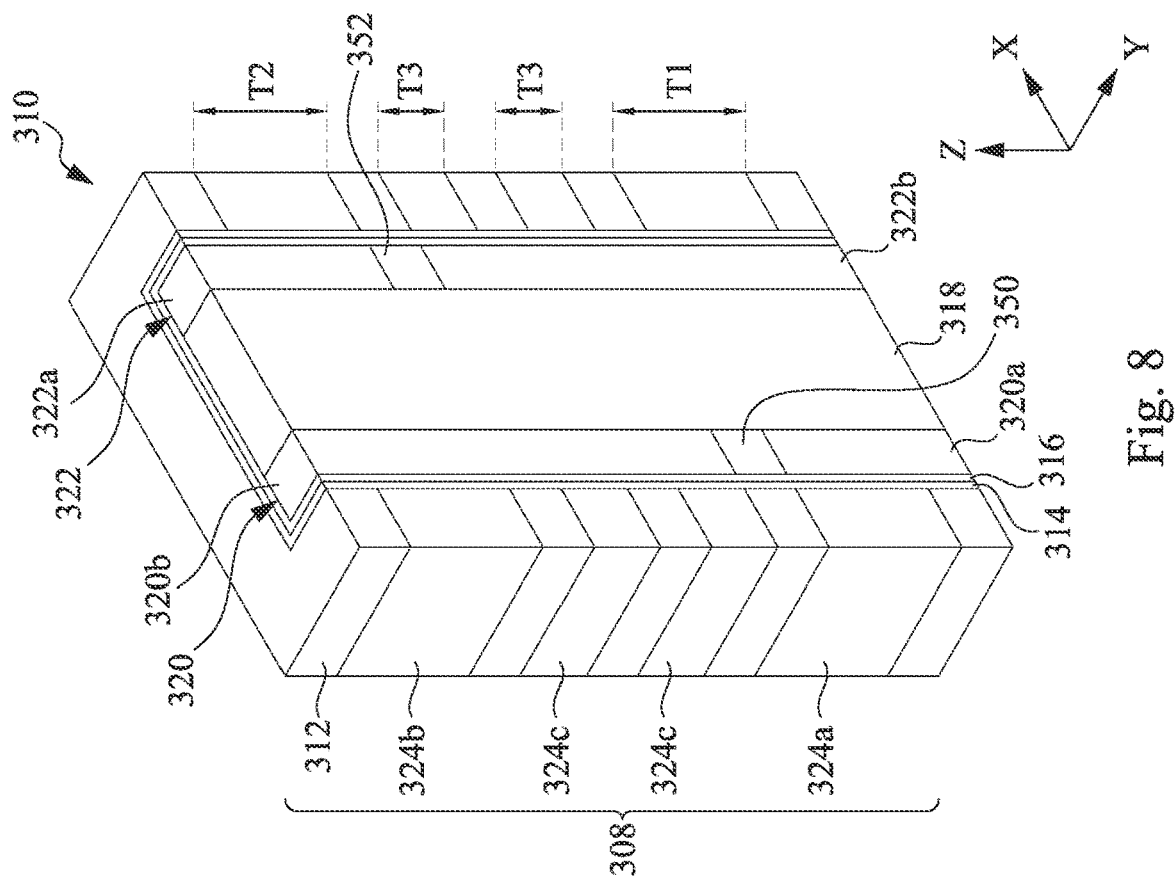

In some embodiments, a thickness of a gate layer corresponding to the active drain portion may be thicker than a thickness of a gate layer associated with the active source portion and the inactive source and drain portions. For example, FIG. 8 is side cross-section view of a semiconductor device 310 (e.g., a memory device), according to an embodiment. The semiconductor device 310 includes a stack 308 including a plurality of gate layers 324 and a plurality of insulating layers 312 alternatively stacked on top of each other. The semiconductor device 310 includes a source structure 320 and a drain structure 322 separated from the source structure 320 by an inner spacer 318, as previously described herein. A channel layer 316 is wrapped around the source structure 320, the inner spacer 318, and the drain structure 322, and a memory layer 314 is wrapped around the channel layer 316. The stack 308 is wrapped around the memory layer 314.

The source structure 320 includes an active source portion 320a, an inactive source portion 320b, and a first dielectric structure 350 interposed therebetween. The active source portion 320a is located proximate to a bottom surface of the semiconductor device 310. Similarly, the drain structure 322 includes an active drain portion 322a, an inactive drain portion 322b, and a second dielectric structure 352 interposed therebetween. The active drain portion 322a is located proximate to a topmost surface of the semiconductor device 310. A first gate layer 324a which is a bottommost gate layer is in electrical communication with the active source portion 320a, and the second gate layer 324b which is a topmost gate layer is in electrical communication with the active drain portion 322a. Third gate layers 324c are disposed between the first and second gate layers 324a and 324b. In some embodiments, a first thickness T1 of the first gate layer 324a and a second thickness T2 of the second gate layer 324b are each larger than a third thickness T3 of the third gate layers 324c. In some embodiments, the first thickness T1 is equal to the second thickness T2. In some embodiments, the second thickness T2 may be in a range of 10 nm to 100 nm, inclusive. In some embodiments, a ratio of the first and/or third thicknesses T1 or T3 to the second thickness T2 to (T1/T3:T2) may be in a range of 1:1 to 1:5, inclusive, however, other ranges and values are also contemplated and are within the scope of this disclosure.

While FIG. 8 showed a thickness of a gate layer corresponding to the active source portion being greater than a thickness of the gate layer corresponding to the active gate portion, in some embodiments, a thickness of a gate layer corresponding to the active source portion may be thicker than a thickness of the gate layers associated with the inactive drain portion and/or the inactive source and drain portion. FIG. 9 is side cross-section view of a semiconductor device 410 (e.g., a memory device), according to an embodiment. The semiconductor device 410 includes a stack 408 including a plurality of gate layers 424 and a plurality of insulating layers 412 alternatively stacked on top of each other. The semiconductor device 410 includes a source structure 420 and a drain structure 422 separated from the source structure 420 by an inner spacer 418, as previously described herein. A channel layer 416 is wrapped around the source structure 420, the inner spacer 418, and the drain structure 422, and a memory layer 414 is wrapped around the channel layer 416. The stack 408 is wrapped around the memory layer 414.

The source structure 420 includes an active source portion 420a, an inactive source portion 420b, and a first dielectric structure 450 interposed therebetween. The active source portion 420a is located proximate to a bottom surface of the semiconductor device 410. Similarly, the drain structure 422 includes an active drain portion 422a, an inactive drain portion 422b, and a second dielectric structure 452 interposed therebetween. The active drain portion 422a is located proximate to a topmost surface of the semiconductor device 410. A first gate layer 424a which is a bottommost gate layer is in electrical communication with the active source portion 420a, and the second gate layer 424b which is a topmost gate layer is in electrical communication with the active drain portion 422a. Third gate layers 424c are disposed between the first and second gate layers 424a and 424b. A first thickness T1 of the first gate layer 324a is larger than the second thickness T2 of the second gate layer 424b and the third thickness T3 of the third gate layers 424c, and the second thickness T2 may be about the same as the third thickness T3. In some embodiments, the first thickness T1 may be in a range of 10 nm to 100 nm, inclusive. In some embodiments, a ratio of the second thickness and/or the third thickness T3 to the first thickness T1 (T2/T3:T1) may be in a range of 1:1 to 1:5 inclusive, but other ranges and values are also contemplated and are within the scope of this disclosure.

While FIGS. 7-9 show a single gate layer associated with the active source and drain portions, in some embodiments, a plurality of gate layers may be associated the active source and/or the active drain portions. For example, FIG. 10 is side cross-section view of a semiconductor device 510 (e.g., a memory device), according to an embodiment. The semiconductor device 510 includes a stack 508 including a plurality of gate layers 524 and a plurality of insulating layers 512 alternatively stacked on top of each other. The semiconductor device 510 includes a source structure 520 and a drain structure 522 separated from the source structure 520 by an inner spacer 518, as previously described herein. A channel layer 516 is wrapped around the source structure 520, the inner spacer 518, and the drain structure 522, and a memory layer 514 is wrapped around the channel layer 516. The stack 508 is wrapped around the memory layer 514.

The source structure 520 includes an active source portion 520a, an inactive source portion 520b, and a first dielectric structure 550 interposed therebetween. The active source portion 520a is located proximate to a bottom surface of the semiconductor device 510. Similarly, the drain structure 522 includes an active drain portion 522a, an inactive drain portion 522b, and a second dielectric structure 552 interposed therebetween. The active drain portion 522a is located proximate to a topmost surface of the semiconductor device 510. A set of first gate layers 524a, which includes a bottommost gate layer and a gate layer immediately above the bottommost gate layer, are in electrical communication with the active source portion 520a. A set of second gate layers 524b, which includes a topmost gate layer and a gate layer immediately below the topmost gate layer, are in electrical communication with the active drain portion 522a. Third gate layers 524c are disposed between the first set and second set of gate layers 524a and 524b. A first thickness T1 of the first set of gate layers 524a may be about the same as a second thickness T2 of the second set of gate layers 524b and a third thickness T3 of the third gate layers 524c.

Figure 11:
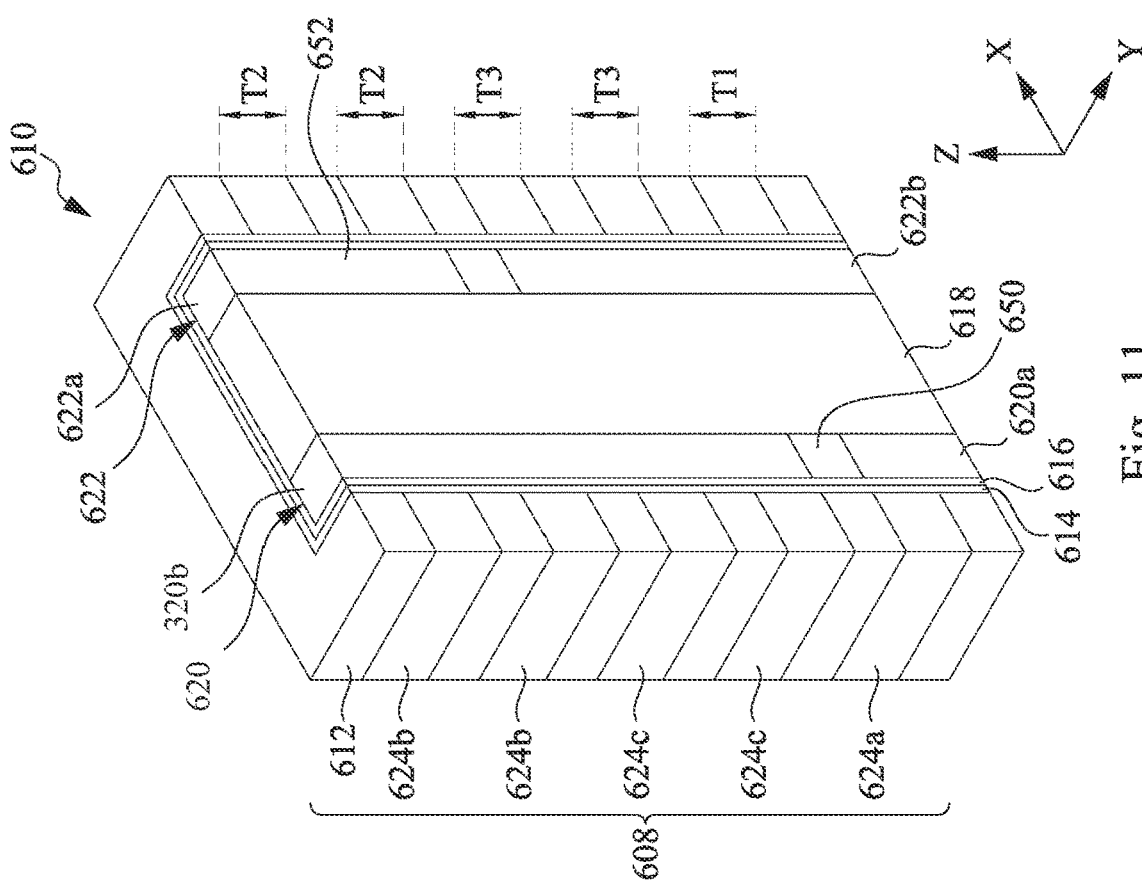

In some embodiments, a plurality of gate layers may be associated with only the active drain portion. For example, FIG. 11 is side cross-section view of a semiconductor device 610 (e.g., a memory device), according to an embodiment. The semiconductor device 610 includes a stack 608 including a plurality of gate layers 624 and a plurality of insulating layers 612 alternatively stacked on top of each other. The semiconductor device 610 includes a source structure 620 and a drain structure 622 separated from the source structure 420 by an inner spacer 618, as previously described herein. A channel layer 616 is wrapped around the source structure 620, the inner spacer 618, and the drain structure 622, and a memory layer 614 is wrapped around the channel layer 616. The stack 608 is wrapped around the memory layer 614.

The source structure 620 includes an active source portion 620a, an inactive source portion 620b, and a first dielectric structure 650 interposed therebetween. The active source portion 620a is located proximate to a bottom surface the semiconductor device 610. Similarly, the drain structure 622 includes an active drain portion 622a, an inactive drain portion 622b, and a second dielectric structure 652 interposed therebetween. The active drain portion 622a is located proximate to a topmost surface of the semiconductor device 610. A first gate layer 624a, which includes a bottommost gate layer is in electrical communication with the active source portion 620a. A set of second gate layers 624b, which include a topmost gate layer and a gate layer immediately below the topmost gate layer, are in electrical communication with the active drain portion 622a. Third gate layers 624c are disposed between the first gate layer and the second set of gate layers 624a and 624b. A first thickness T1 of the first gate layer 624a may be about the same as a second thickness T2 of the second set of gate layers 624b and a third thickness T3 of the third gate layers 624c, or different therefrom. Moreover, the active drain portion 622a is thicker than the active source portion 620a.

Figure 12:
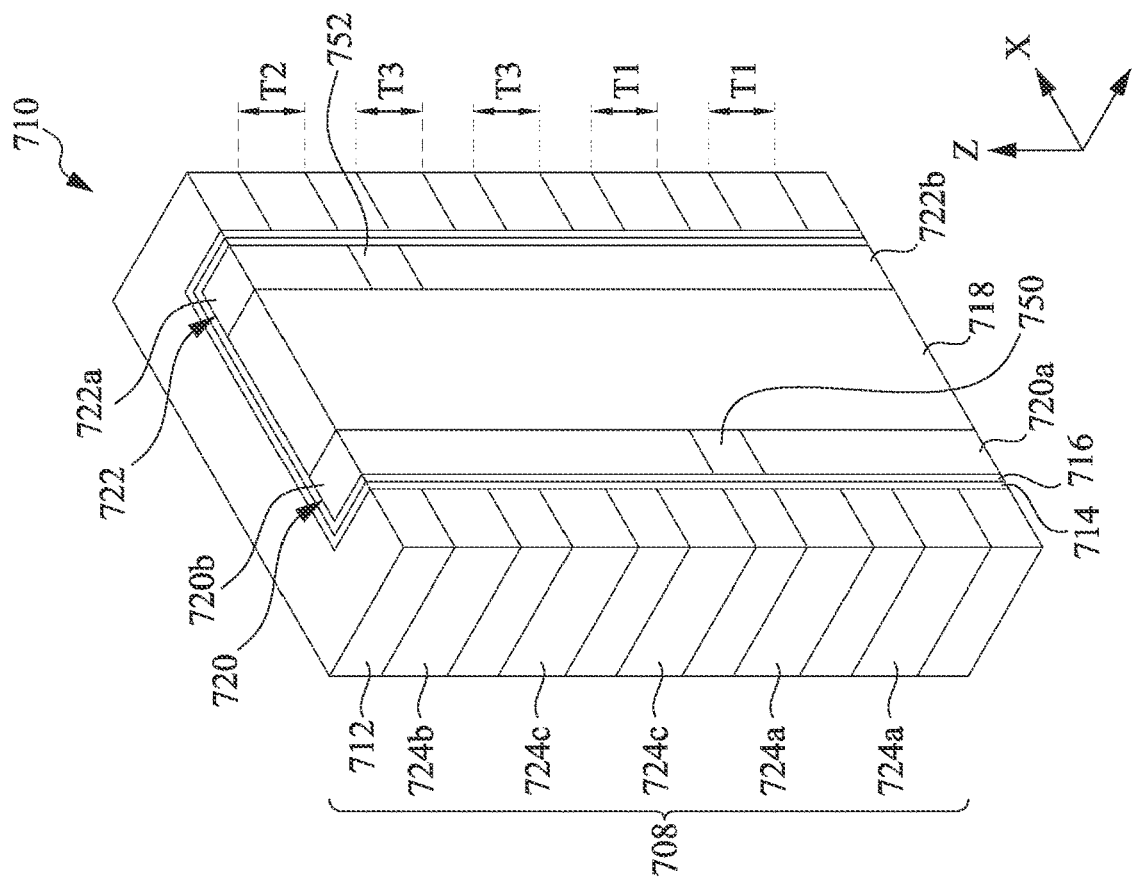

In some embodiments, a plurality of gate layers may be associated with only the active source portion. For example, FIG. 12 is side cross-section view of a semiconductor device 710 (e.g., a memory device), according to an embodiment. The semiconductor device 710 includes a stack 708 including a plurality of gate layers 724 and a plurality of insulating layers 712 alternatively stacked on top of each other. The semiconductor device 710 includes a source structure 720 and a drain structure 722 separated from the source structure 720 by an inner spacer 718, as previously described herein. A channel layer 716 is wrapped around the source structure 720, the inner spacer 718, and the drain structure 722, and a memory layer 714 is wrapped around the channel layer 716. The stack 708 is wrapped around the memory layer 714.

The source structure 720 includes an active source portion 720a, an inactive source portion 720b, and a first dielectric structure 750 interposed therebetween. The active source portion 720a is located proximate to a bottom surface the semiconductor device 710. Similarly, the drain structure 722 includes an active drain portion 722a, an inactive drain portion 722b, and a second dielectric structure 752 interposed therebetween. The active drain portion 722a is located proximate to a topmost surface of the semiconductor device 710. A set of first gate layers 724a, which includes a bottommost gate layer and a gate layer immediately above the bottommost gate layer, are in electrical communication with the active source portion 720a. A second gate layer 724b, which includes a topmost gate layer is in electrical communication with the active drain portion 722a. Third gate layers 724c are disposed between the first set of gate layers and the second gate layer 724a and 724b. A first thickness T1 of the first set of gate layers 724a may be about the same as a second thickness T2 of the second set of gate layers 724b and a third thickness T3 of the third gate layers 724c, or different therefrom. Moreover, the active source portion 720a has a larger thickness than the active drain portion 722a.

Figure 13A:
FIGS. 13A-13B illustrate a schematic flowchart of a method for manufacturing a semiconductor die including semiconductor devices that have a dielectric structure embedded within a source structure and drain structure of the semiconductor devices, according to some embodiments.
Figure 13B:
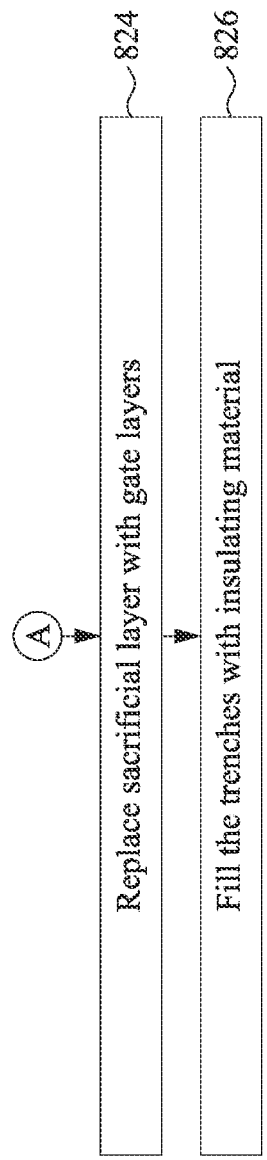

FIGS. 13A-13B illustrate a flowchart of a method 800 for forming a semiconductor die 900, for example, a die including a plurality of 3D memory devices (e.g., any of the semiconductor devices described with respect to FIGS. 1-12), according to an embodiment. For example, at least some of the operations (or steps) of the method 800 may be used to form a 3D memory device (e.g., the semiconductor device 110, 110a-d, 210, 310, 410, 510, 610, 710), a nanosheet transistor, a nanowire transistor deice, a vertical transistor device, or the like. It should be noted that the method 800 is merely an example, and is not intended to limit the present disclosure. Accordingly, it is understood that additional operations may be provided before, during, and after the method 800 of FIGS. 13A-13B, and that some other operations may only be described briefly herein. In some embodiments, operations of the method 800 may be associated with perspective views and associate cross-section views of an example semiconductor die 900 at various fabrication stages as shown in FIGS. 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25, 26A, 26B, 27A, 27B and 28, and in some embodiments are represented with respect to the semiconductor die 900 that represents a 3D memory device, the operations are equally applicable to any other semiconductor device, for example, the semiconductor devices 110, 110a-d, 210, 310, 410, 510, 610, 710 shown in FIGS. 1-12 or any other semiconductor die (e.g., a GAA FET device, a nanosheet transistor device, a nanowire transistor device, a vertical transistor device, etc.). Although FIGS. 14A-28 illustrate the semiconductor die 900 including the plurality of semiconductor devices 110, it is understood the semiconductor die 900 may include a number of other devices such as inductors, fuses, capacitors, coils, etc., which are not shown in FIGS. 14A-28, for purposes of clarity of illustration.

The method 800 may generally include providing a stack comprising a plurality of insulating layers and a plurality of sacrificial layers alternatively stacked on top of each other in a vertical direction. A plurality of cavities are formed through the stack. A memory layer is formed on walls of each of the plurality of cavities extending in the vertical direction. A channel layer is formed on inner surfaces of the memory layer. A source structure and a drain structure axially separated apart from the source structure are formed within the cavities such that a dielectric structure is embedded within the source structure and/or the drain structure, the dielectric structure dividing the source structure and/or the drain structure into an active portion, and an inactive portion electrically isolated from the active portion. A plurality of gate layers are formed by replacing the plurality of sacrificial layers so as to form an array of memory devices. In some embodiments, a first portion of the plurality of the gate layers is in electrical communication with the active portion of the source structure, and a second portion of the gate layers different from the first portion is in electrical communication with the active portion of the drain structure.

Expanding further the method 800 starts with operation 802 that includes providing a substrate, for example, the substrate 107 shown in FIGS. 1 and 14A. The substrate 107 may be a semiconductor substrate, such as a bulk semiconductor, a semiconductor-on-insulator (SOI) substrate, or the like, which may be doped (e.g., with a p-type or an n-type dopant) or undoped. The substrate 107 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate 107 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 14B:
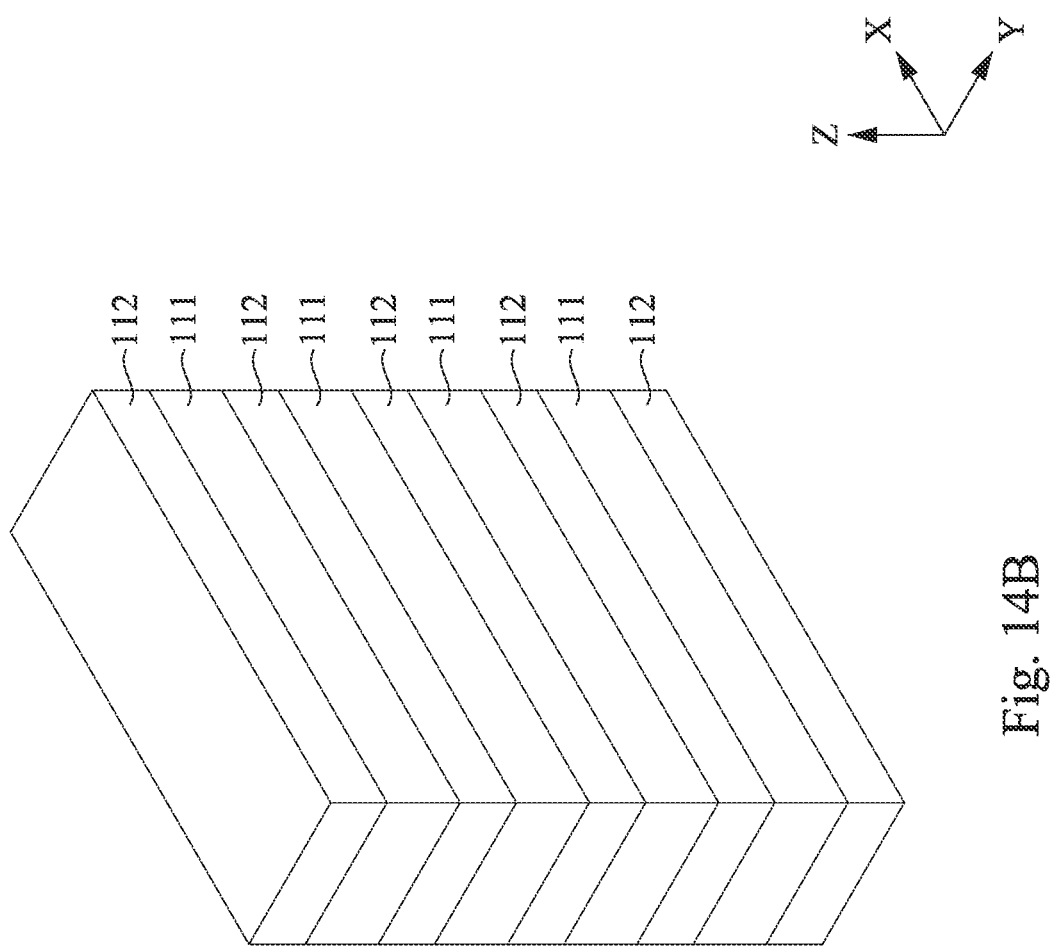

At 804, a stack (e.g., the stack 108 shown in FIG. 14A-B) is formed on the substrate. The stack includes a plurality of insulating layers (e.g., the insulating layers 112) and a plurality of sacrificial layers (e.g., the sacrificial layers 111 shown in FIG. 14A-B) alternately stacked on top of each other in the vertical direction (e.g., the Z-direction). Corresponding to operations 802-804, FIG. 14A is a top, perspective view of the stack 108 disposed on the substrate 107, and FIG. 14B is a cross-section view of a portion of the semiconductor die 900 indicated by the arrow A in FIG. 14A. The insulating layers 112 and the sacrificial layers 111 are alternately disposed on top of one another in the Z-direction. For example, one of the sacrificial layers 111 is disposed over one of the insulating layers 112, then another one of the insulating layers 112 is disposed on the sacrificial layer 111, so on and so forth. As shown in FIGS. 14A-14B, a topmost layer (e.g., a layer distal most from the substrate 107) and a bottommost layer (e.g., a layer most proximate to the substrate 107) of the stack 108 may include an insulating layer 112. While FIGS. 14A-14B show the stack 108 as including 5 insulating layers 112 and 4 sacrificial layers, the stack 108 may include any number of insulating layers 112 and sacrificial layers 111 (e.g., 4, 5, 6, 7, 8, 16, 24, 48, 64, 128, or even more). In various embodiments, if the number of sacrificial layers 111 in the stack 108 is n, a number of insulating layers 112 in the stack 108 may be n+1.

In some embodiments, each of the plurality of insulating layers 112 may have about the same thickness, for example, in a range of about 5 nm to about 100 nm, inclusive. Moreover, the sacrificial layers 111 may have the same thickness or different thickness from the insulating layers 112. The thickness of the sacrificial layers 111 may range from a few nanometers to few tens of nanometers (e.g., in a range of 5 nm to 100 nm, inclusive, but other ranges and values are also contemplated and are within the scope of this disclosure). In other embodiments, a topmost sacrificial layer 111 and/or a bottom most sacrificial layer 111 may be thicker (e.g., 1.2×, 1.4×. 1.6×, 1.8×, 2×, 2.5×, or 3× thicker) than the other sacrificial layers 111 disposed therebetween.

The insulating layers 112 and the sacrificial layers 111 have different compositions. In various embodiments, the insulating layers 112 and the sacrificial layers 111 have compositions that provide for different oxidation rates and/or different etch selectivity between the respective layers. In some embodiments, the insulating layers 112 may be formed from SiO, and the sacrificial layers 111 may be formed from SiN. In various embodiments, the insulating layers 112 may be formed from any suitable first material (e.g., an insulating material) as described with respect to the semiconductor device 110, and the sacrificial layers 111 may be formed from a second material (e.g., also an insulating material) that is different from the first material. In some embodiments, the sacrificial layers may 111 include SiN, $HfO_2$, TaOx, $TiO_x$, $AlO_x$, or any other material that has a high etch selectivity relative to the insulating layers 112 (e.g., an etch selectivity ratio of at least 1:100). The sacrificial layers 111 are merely spacer layers that are eventually removed and do not form an active component of the semiconductor die 900.

In various embodiments, the insulating layers 112 and/or the sacrificial layers 111 may be epitaxially grown from the substrate 107. For example, each of the insulating layers 112 and the sacrificial layers 111 may be grown by a molecular beam epitaxy (MBE) process, a chemical vapor deposition (CVD) process such as a metal organic CVD (MOCVD) process, a furnace CVD process, and/or other suitable epitaxial growth processes. During the epitaxial growth, the crystal structure of the substrate 107 extends upwardly, resulting in the insulating layers 112 and the sacrificial layers 111 having the same crystal orientation as the substrate 107. In other embodiments, the insulating layers 112 and the sacrificial layers 111 may be grown using an atomic layer deposition (ALD) process.

Figure 15A:
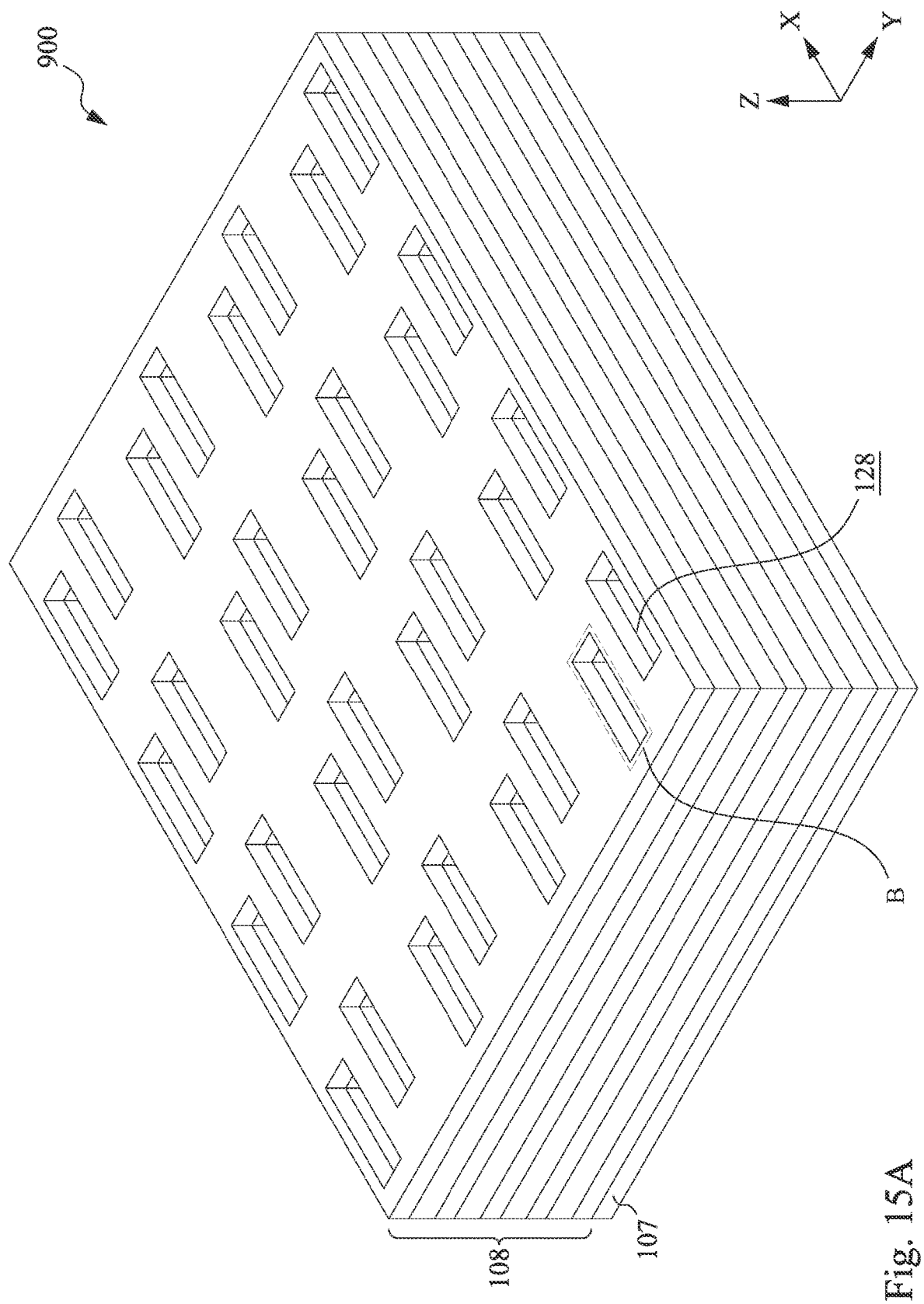
Figure 15B:
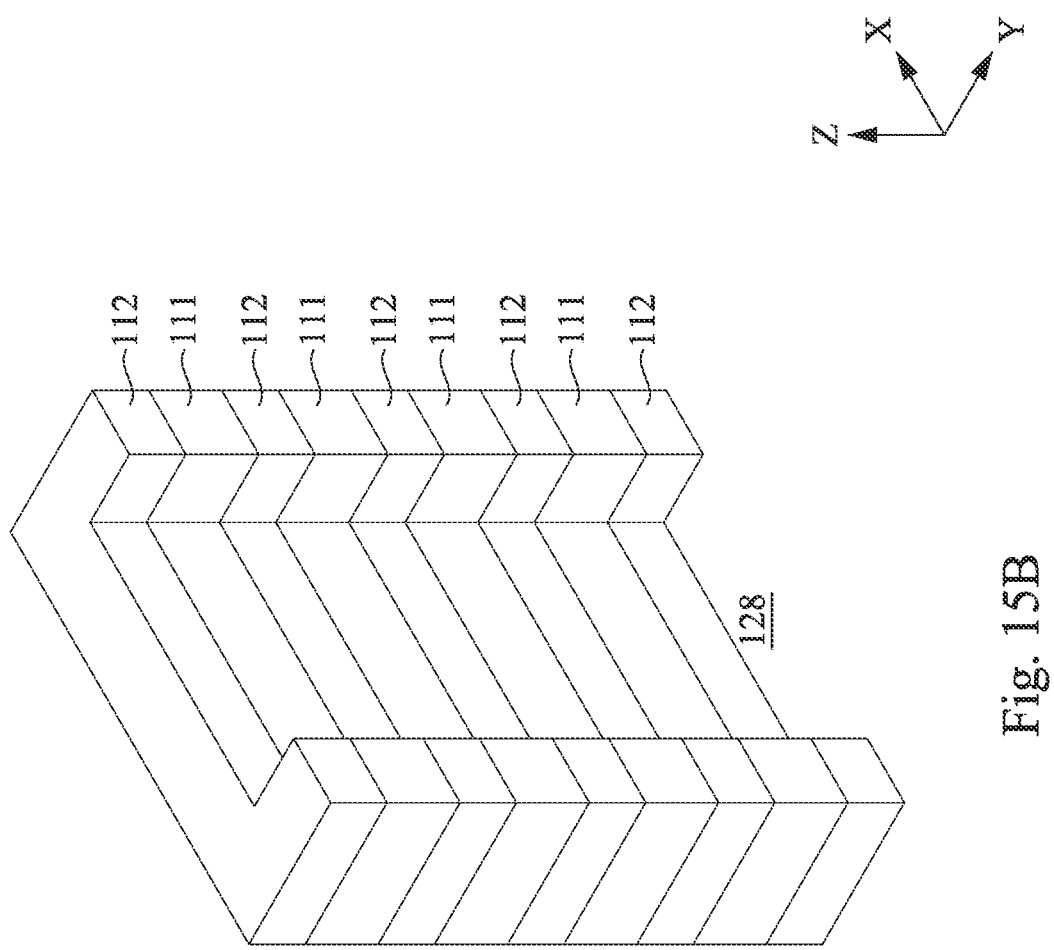

At 806, an array of cavities are formed through the stack extending from the topmost insulating layer to the substrate in a vertical direction (e.g., the Z-direction). Corresponding to operation 806, FIG. 15A is a top, perspective view of the semiconductor die 900 after an array of cavities 128 have been formed through the stack 108 up to the substrate 107 by etching the stack 108 in the Z-direction. FIG. 15B is a side cross-section view of a portion of the semiconductor die 100 indicated by the arrow B in FIG. 15A. The etching process for forming the array of cavities 128 may include a plasma etching process, which can have a certain amount of anisotropic characteristic. For example, the cavities 128 may be formed, for example, by depositing a photoresist or other masking layer on a top surface of the semiconductor die 900, i.e., the top surface of the topmost insulating layer 112 of the stack 108, and a pattern corresponding to the cavities 128 defined in the masking layer (e.g., via photolithography, e-beam lithography, or any other suitable lithographic process). In other embodiments, a hard mask may be used.

Subsequently, the stack 108 may be etched using a plasma etching process (including radical plasma etching, remote plasma etching, and other suitable plasma etching processes, ME, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the cavities 128. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 15A-15B, the etch used to form the array of cavities 128 etches through each of the sacrificial layers 111 and insulating layers 112 of the stack 108 such that each of the array of cavities 128 extend form the topmost insulating layer 112 through the bottommost insulating layer 112 to the substrate 107.

At operation 808, a memory layer is formed on walls of each of the cavities, the memory layer extending from a top surface of the semiconductor die to the substrate in the vertical direction (e.g., the Z-direction). At operation 810, a channel layer is formed on an inner surface of the memory layer, the channel layer extending from a top surface of the semiconductor die to the substrate in the vertical direction (e.g., the Z-direction). At operation 812, an insulating material is deposited within each of the array of cavities to fill the cavities with the insulating material and form an isolation layer.

Figure 16A:
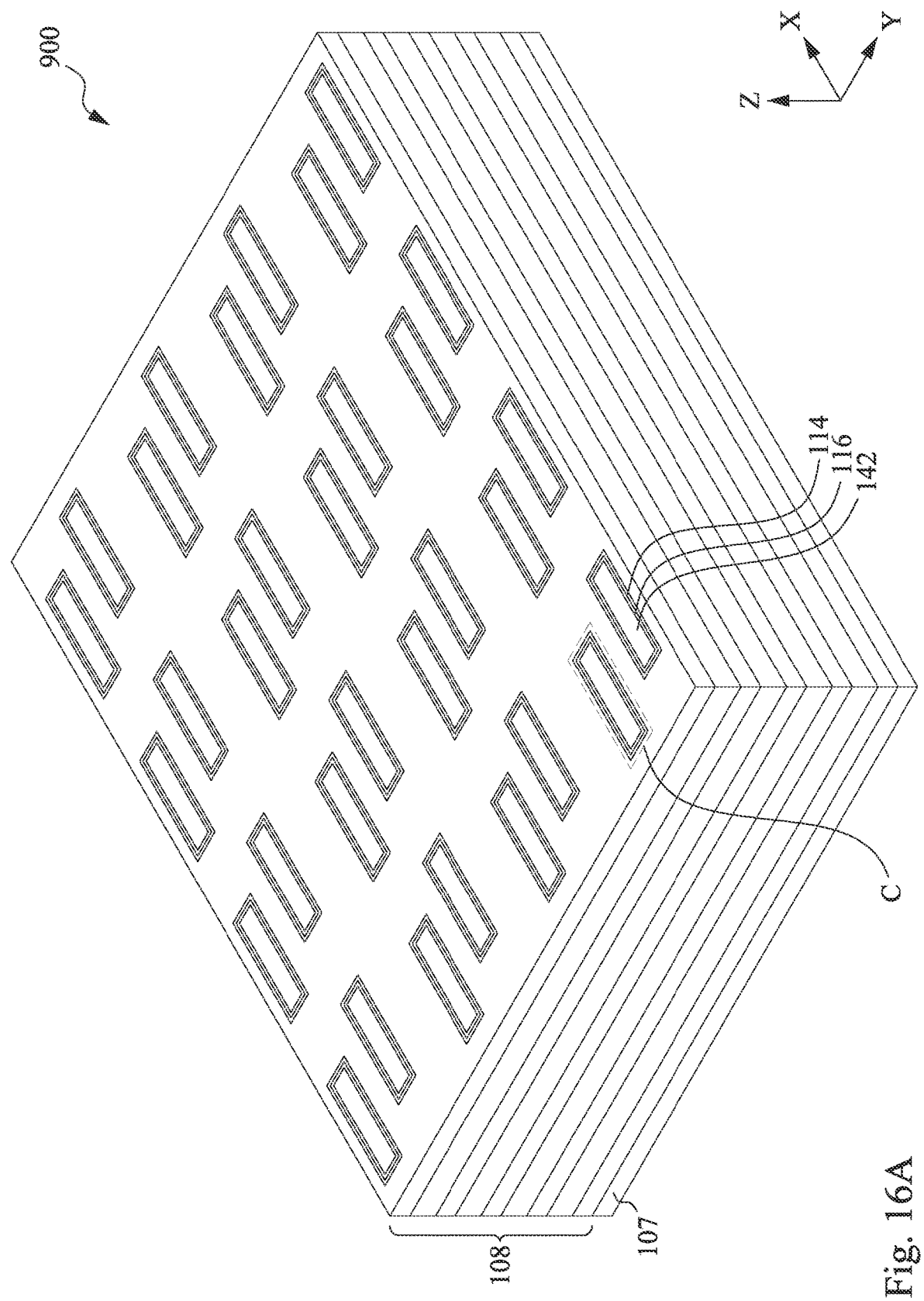
Figure 16B:
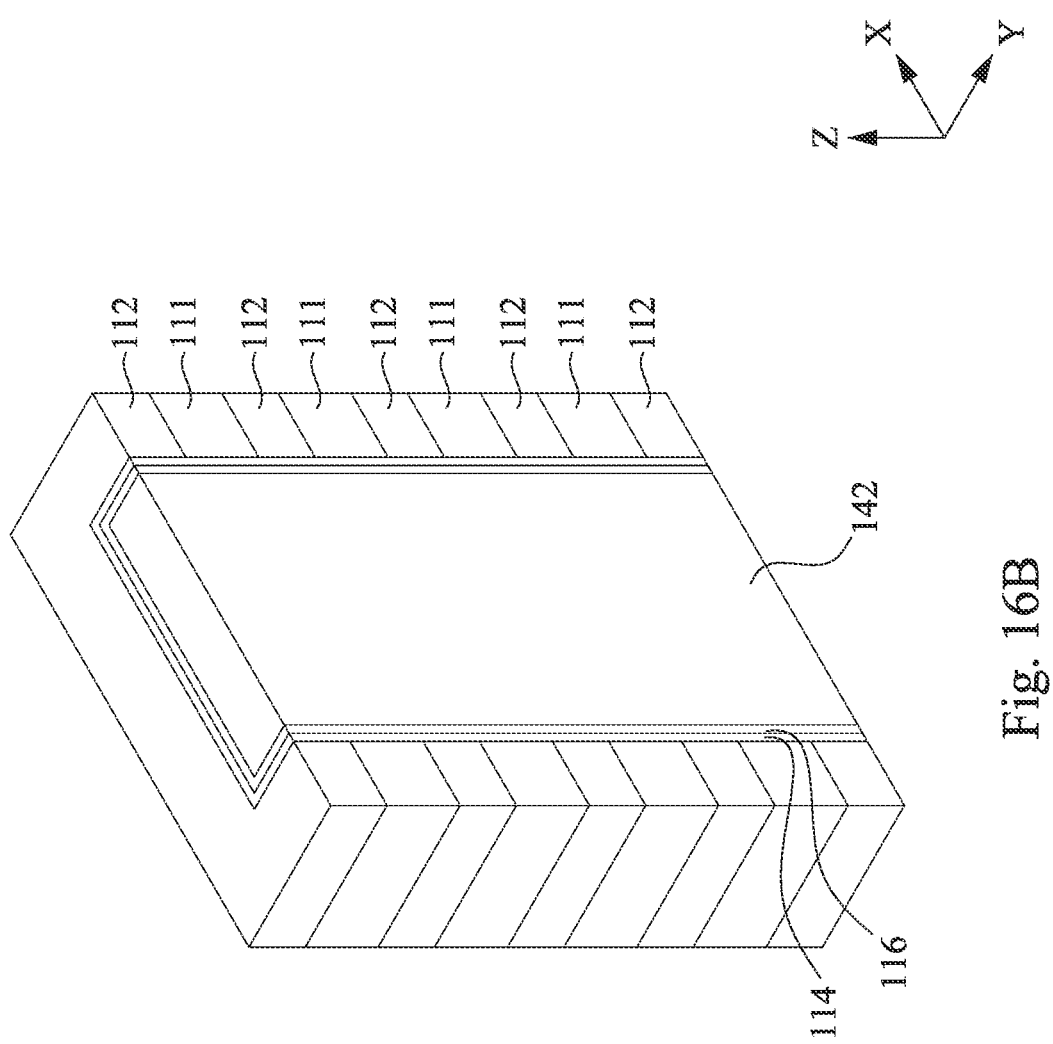

Corresponding to operations 808-812, FIG. 16A is a top, perspective view of the semiconductor die 900 after formation of the memory layer 114, the channel layer 116, and an isolation layer 142 that fills the cavities 128. The memory layer 114 may include a ferroelectric material, for example, lead zirconate titanate (PZT), $PbZr/TiO_3$, $BaTiO_3$, $PbTiO_2$, $HfO_2$, $Hr1-xZ_{rx}O_2$, $ZrO_2$, $TiO_2$, NiO, $TaO_x$, $Cu_2O$, $Nb_2O_5$, $AlO_x$, etc. The memory layer 114 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layer 114 is continuous on the walls of the cavities 128.

The channel layer 116 is formed on inner surfaces of the memory layer 114 and extends in the Z-direction. In some embodiments, the channel layer 116 may be formed from a semiconductor material, for example, Si (e.g., polysilicon or amorphous silicon that may be n-type or p-type), Ge, SiGe, silicon carbide (SiC), IGZO, ITO, IZO, ZnO, IWO, etc. The channel layer 116 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the channel layer 116 is continuous on the inner surface of the memory layer 114.

Each of the cavities 128 are then filled with an insulating material (e.g., SiO, SiN, SiON, SiCN, SiC, SiOC, SiOCN, the like, or combinations thereof) so as to form the isolation layer 142. In some embodiments, the isolation layer 142 may be formed from the same material as the plurality of insulating layers 112 (e.g., $SiO_2$, SiN, SiON, SiCN, $HfO_2$, $TaO_x$, TiOx, $AlO_x$, etc.). The isolation layer 142 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. A CMP operation may be performed after forming the isolation layer 142 to planarize the top surface of the semiconductor die 900.

Figure 17A:
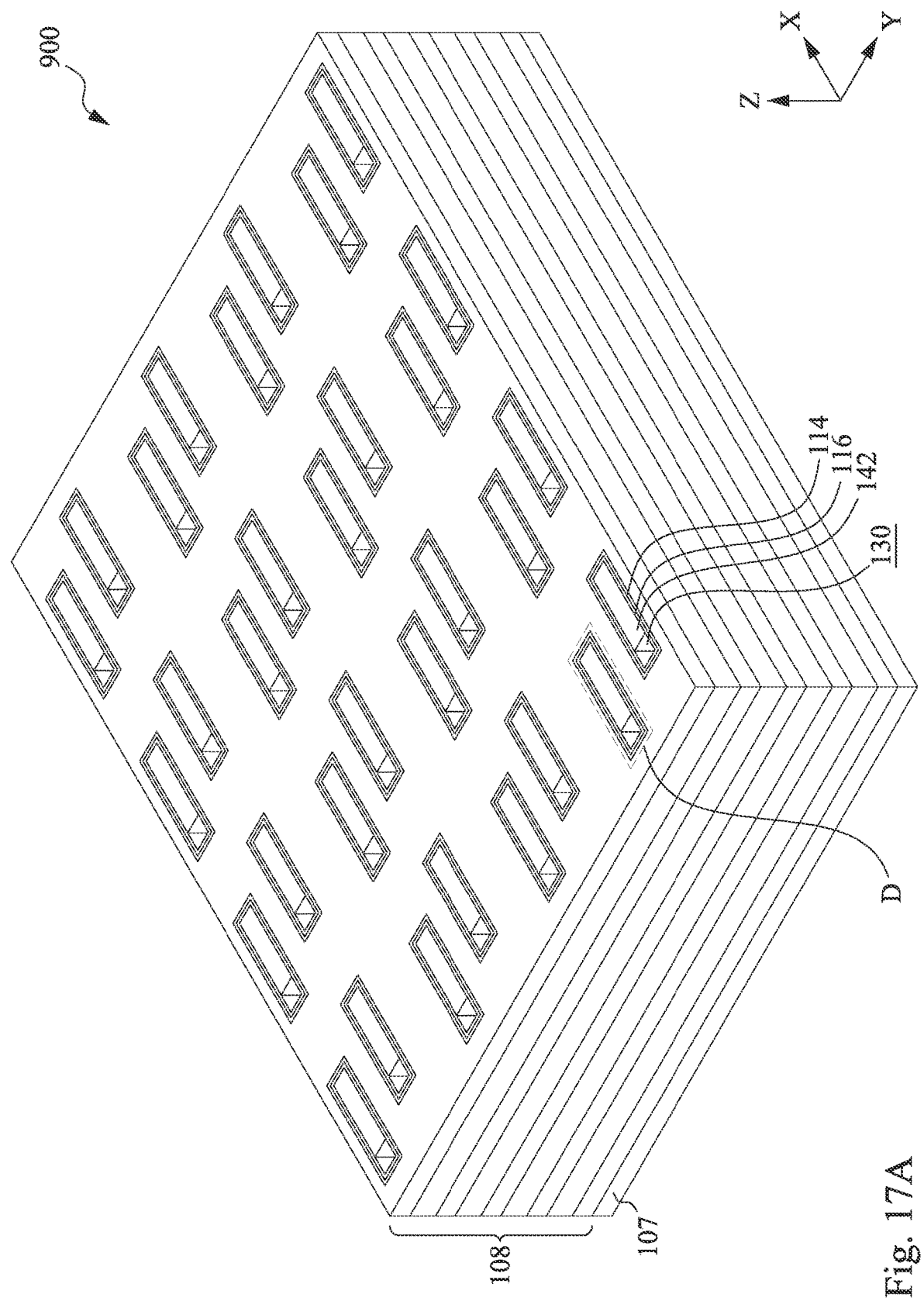
Figure 17B:
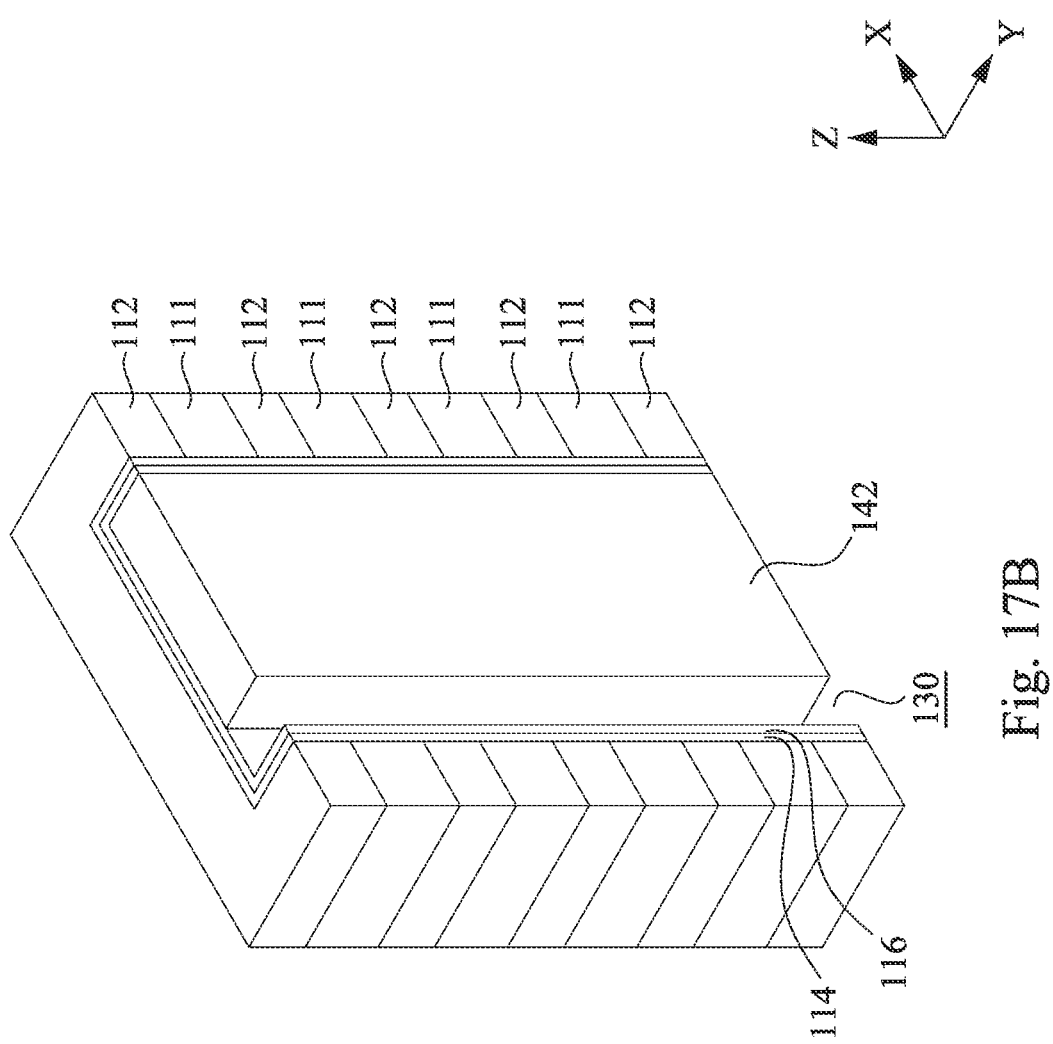

At operation 814, a first cavity is formed through a first axial end of the isolation layer. Corresponding to operation 814, FIG. 17A is a top, perspective view of the semiconductor die 900, and FIG. 17B is a side cross-section view of a portion of the semiconductor die 900 indicated by the arrow D in FIG. 17A after forming a first cavity 130 at a first axial end of the isolation layer 142 of each of the semiconductor devices 110 in the X-direction. The first cavity 130 is etched through the isolation layer 142 in the Z-direction from a top surface of the semiconductor die 900 to the substrate 107. The first cavity 130 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first cavity 130. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 18A:
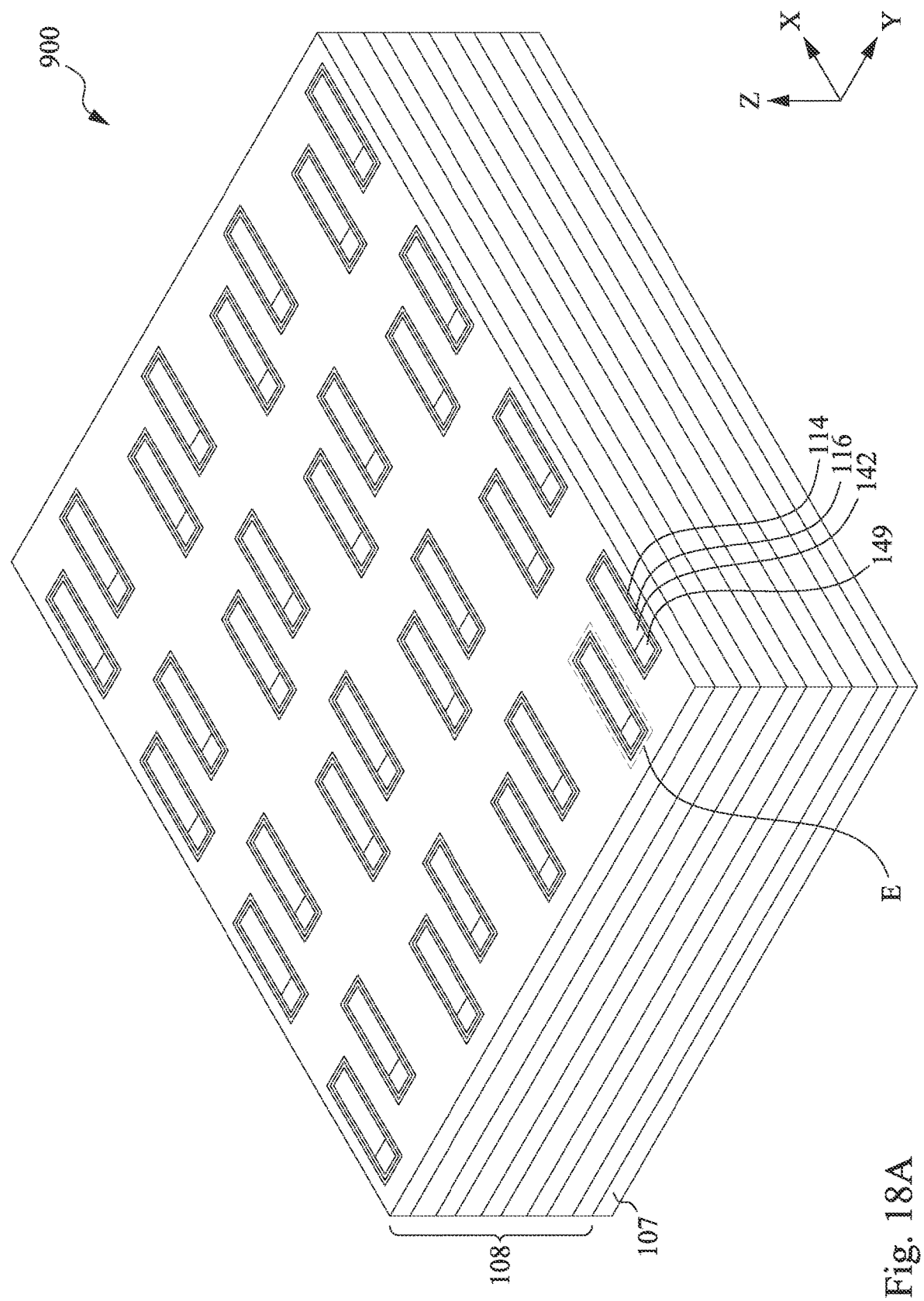
Figure 18B:
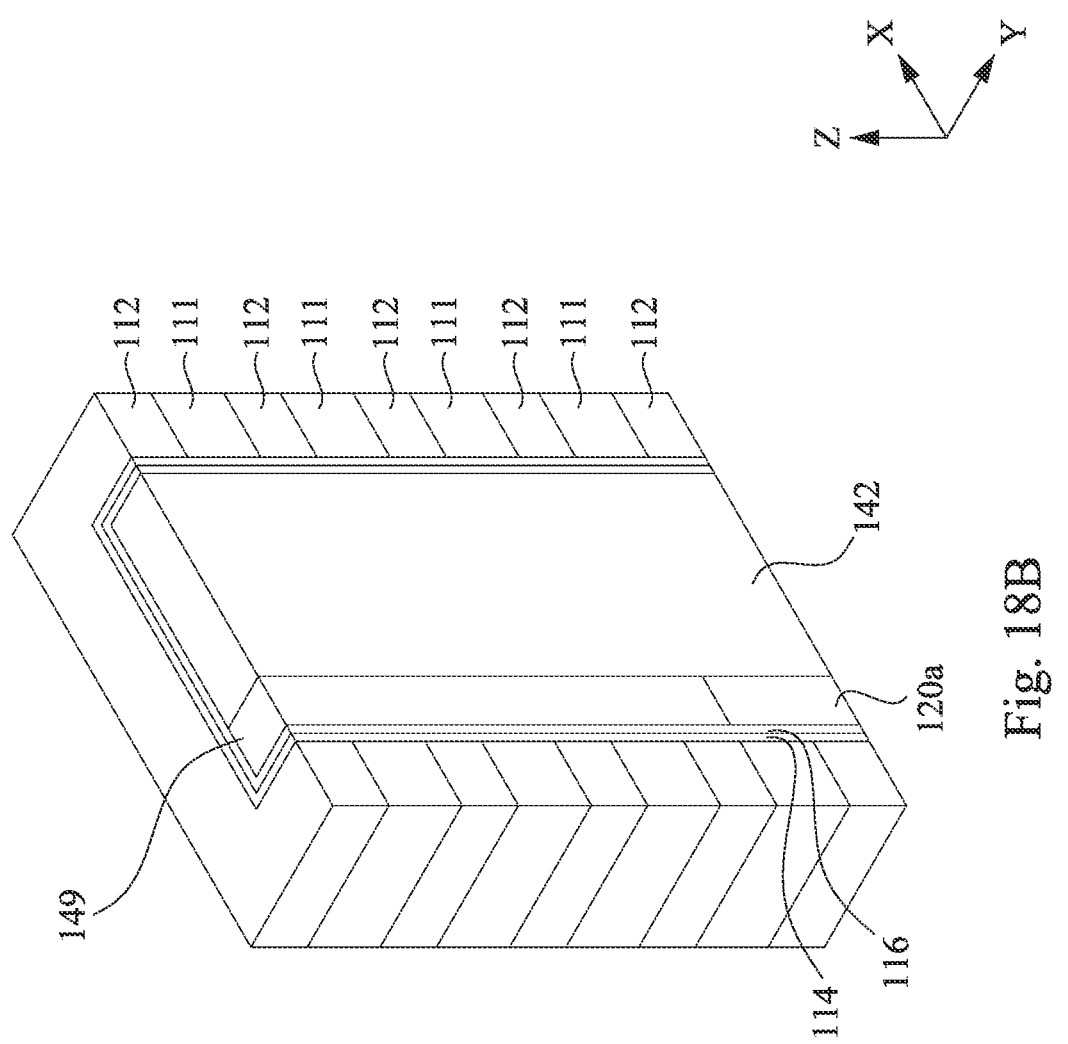
Figure 19A:
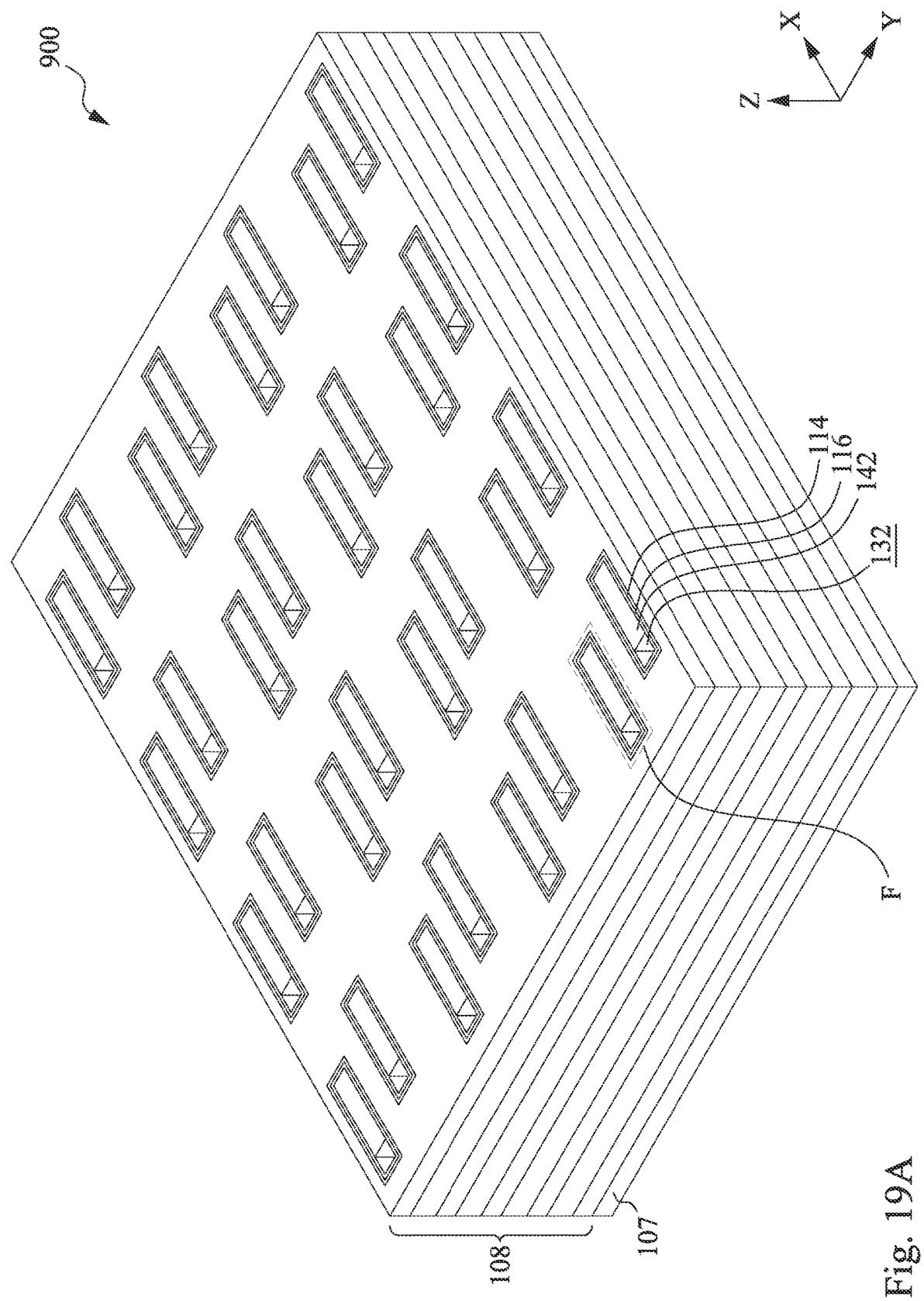
Figure 20A:
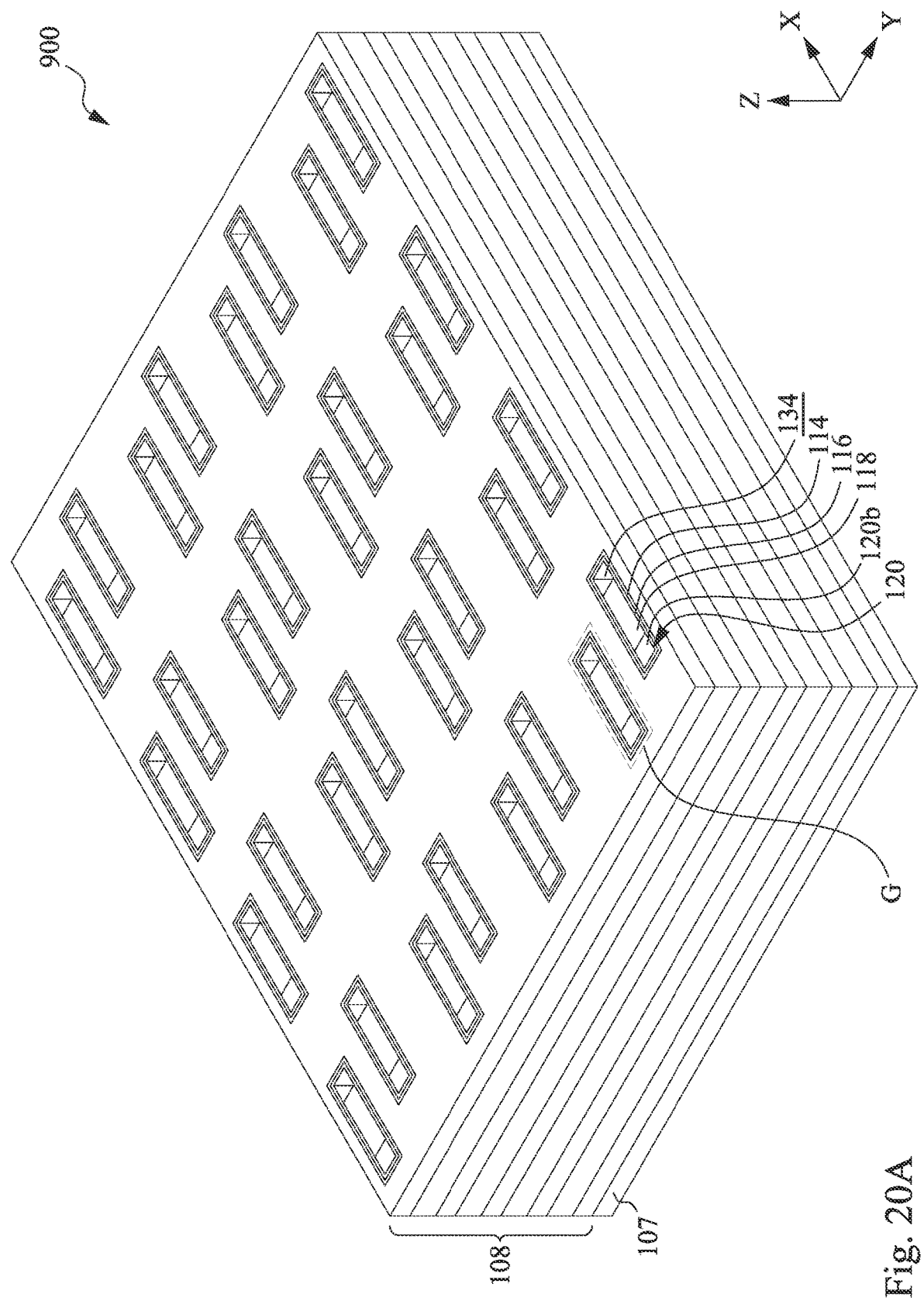

At operation 816, a source structure (e.g., the source structure 120) is formed in the first cavity. Corresponding to operation 816, FIGS. 18A, 19A, and 20A are top, perspective views of semiconductor die 900 at various stages of the forming the source structure 120. Referring to FIG. 18A and FIG. 18B, which is a side cross-section view of a portion of the semiconductor die 900 indicated by the arrow E in FIG. 18A, the active source portion 120a is formed by depositing a source material in the first cavity 130 up to a predetermined thickness. In other embodiments, the first cavity 130 may be filled with the source material, and the source material etched back (e.g., via a wet or dry etching process) to form the active source portion 120a. The source material may include Al, Ti, TiN, TaN, Co, Ag, Au, Cu, Ni, Cr, Hf, Ru, W, Pt, WN, Ru, any other suitable material or a combination or alloy thereof. In some embodiments, the source material may be deposited such that the active source portion 120a has a thickness which is sufficient for at least a portion of the active source portion 120a to be adjacent to at least one sacrificial layer 111 (e.g., a bottommost sacrificial layer 111) in the X-Y plane. The rest of the first cavity 130 is then filled with a dielectric material 149 up to a top surface of the semiconductor die 900. The dielectric material 149 may include a dielectric material SiN, $HfO_2$, $TaO_x$, $TiO_x$, $AlO_x$, etc. The source material for the active source portion 120a and the dielectric material 149 may be deposited using any suitable method including, for example, molecular beam epitaxy (MBE), atomic layer deposition (ALD), chemical vapor deposition (CVD), plasma enhanced CVD (PECVD), metal organic CVD (MOCVD,) a high aspect ratio process (HARP), epitaxial growth, and the like. A CMP operation may be performed after forming the isolation layer 142 to planarize the top surface of the semiconductor die 900.

Figure 19B:
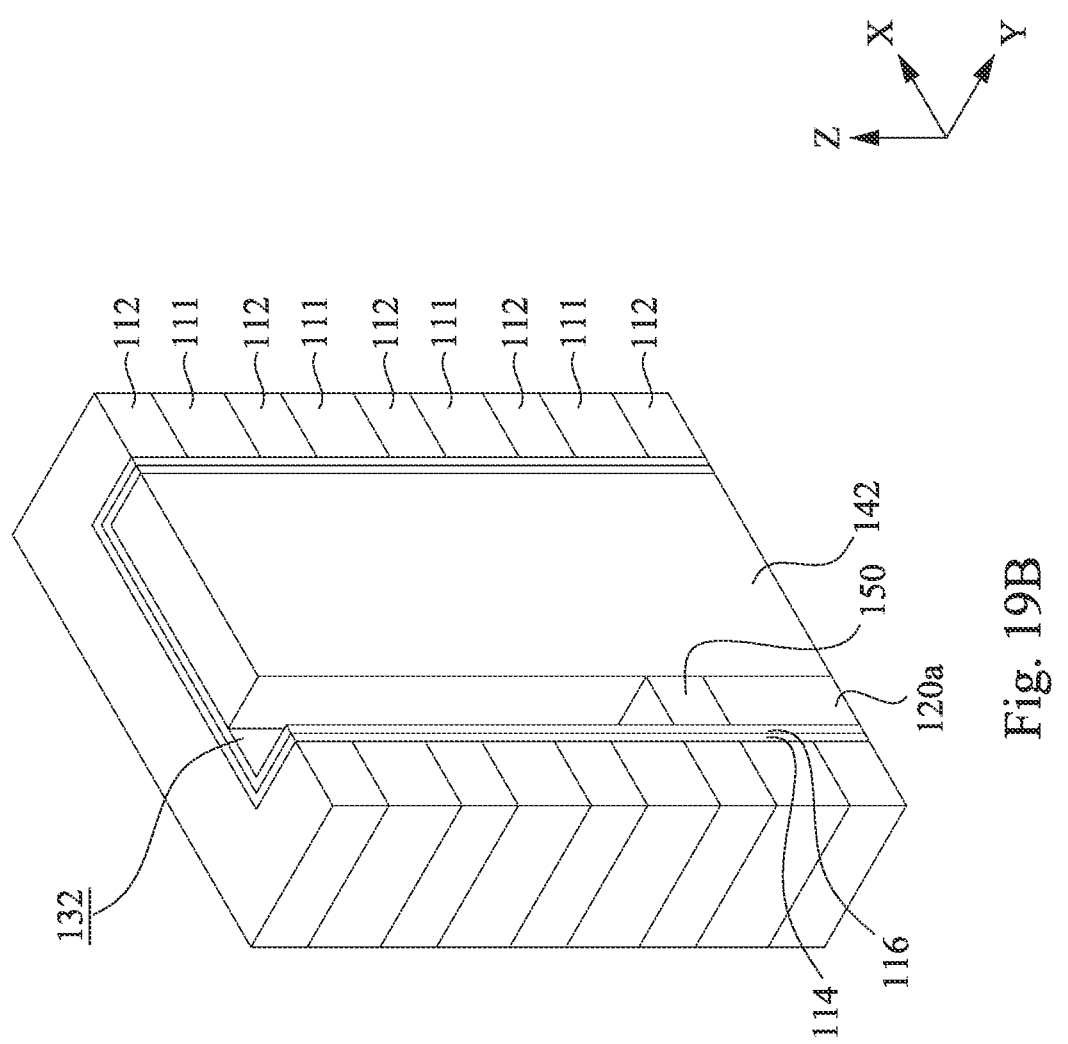

FIG. 19A shows a top, perspective view of the semiconductor die 900 after forming the first dielectric structure 150, and FIG. 19B shows a side cross-section view of a portion of the semiconductor die 900 indicated by the arrow F in FIG. 19A. To form the first dielectric structure 150, the dielectric material 149 is etched until only a portion of the dielectric material 149 corresponding to the first dielectric structure 150 remains, and a first void 132 is formed above the first dielectric structure 150. The dielectric material 149 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first void 132. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 20B:
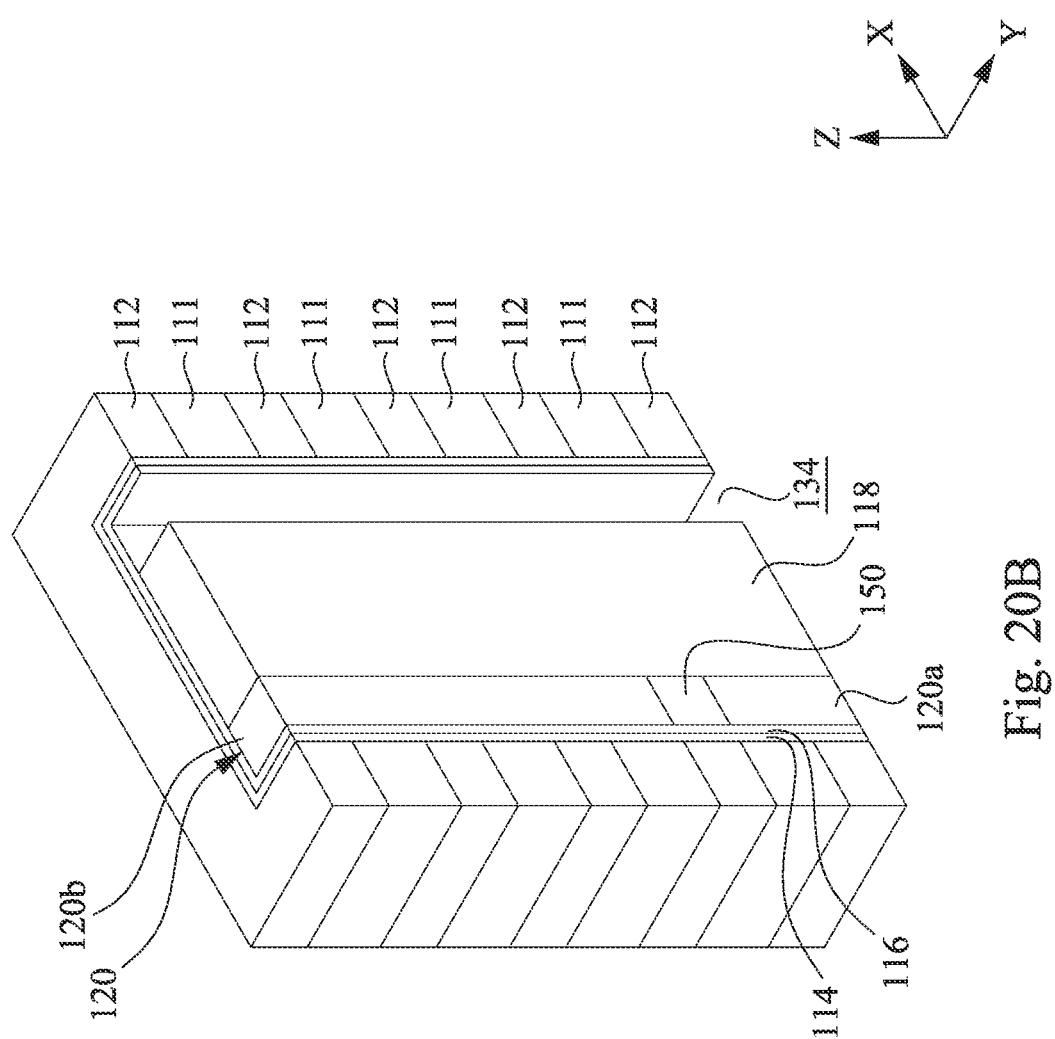

FIG. 20A is a top, perspective view of the semiconductor die 900 after forming the source structure 120, and FIG. 20B is a side cross-section view of a portion of the semiconductor die 900 indicated by the arrow G in FIG. 20A. To form the first source structure, the first void 132 is completely filled with the source material to form the inactive source portion 120b. The source material for the inactive source portion 120b may be deposited using any suitable method including, for example, molecular beam deposition (MBD), atomic layer deposition (ALD), chemical vapor deposition (CVD), plasma enhanced CVD (PECVD), metal organic CVD (MOCVD,) a high aspect ratio process (HARP), epitaxial growth, and the like. A CMP operation may be performed after forming the isolation layer 142 to planarize the top surface of the semiconductor die 900.

At operation 818, a second cavity is formed through a second axial end of the isolation layer. Corresponding to operation 818, FIG. 20A-20B show the semi-conductor die 900 after forming a second cavity 134 at a second axial end of the isolation layer 142 of each of the semiconductor devices 110 in the X-direction opposite the first axial end. Forming the second cavity 134 results in formation of the inner spacer 118 from the isolation layer 142, which extends between the source structure 120 and the drain structure 122 in the X-direction. The second cavity 134 is etched through the isolation layer 142 in the Z-direction from a top surface of the semiconductor die 900 to the substrate 107. The second cavity 134 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second cavity 134. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 21A:
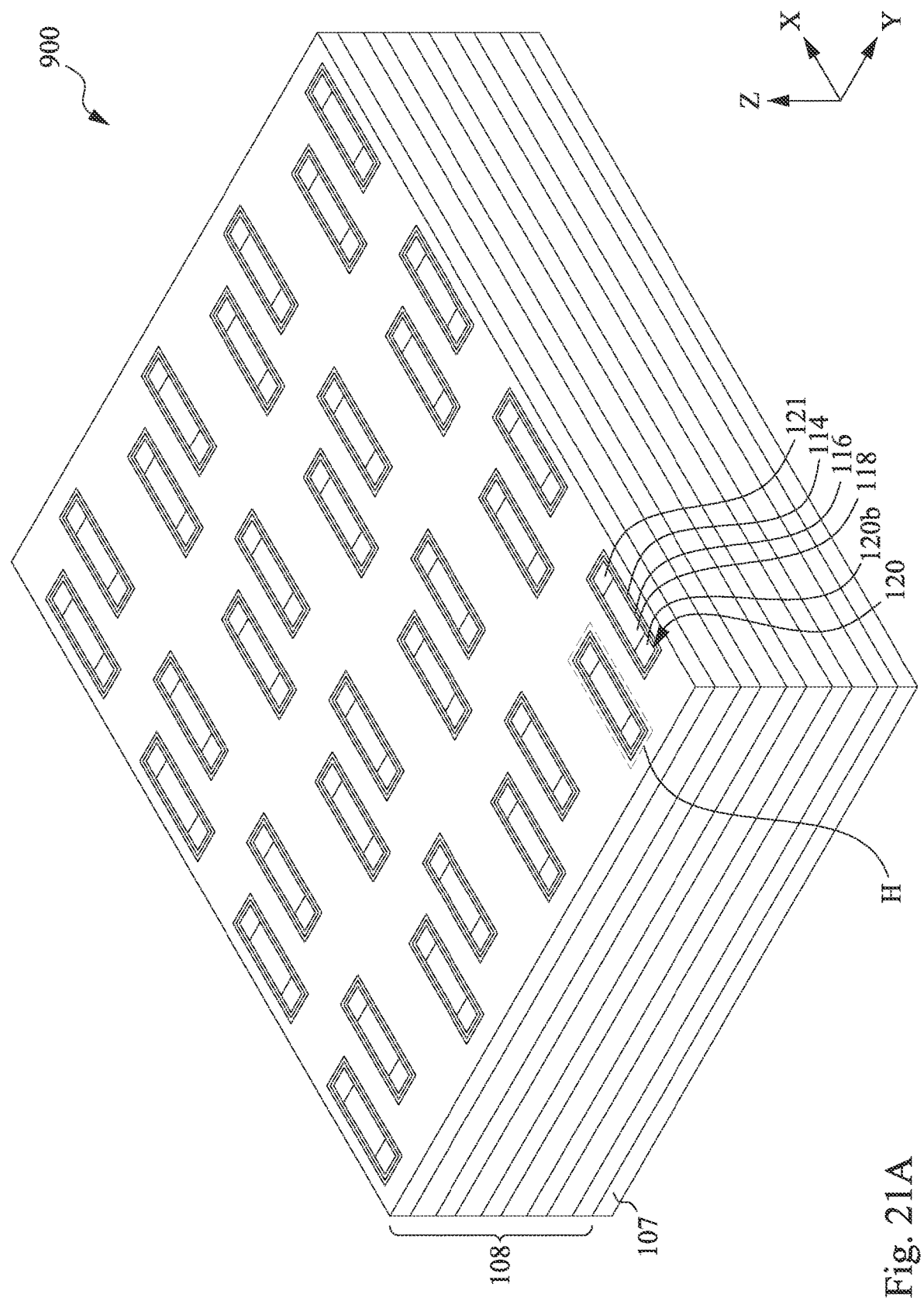
Figure 21B:
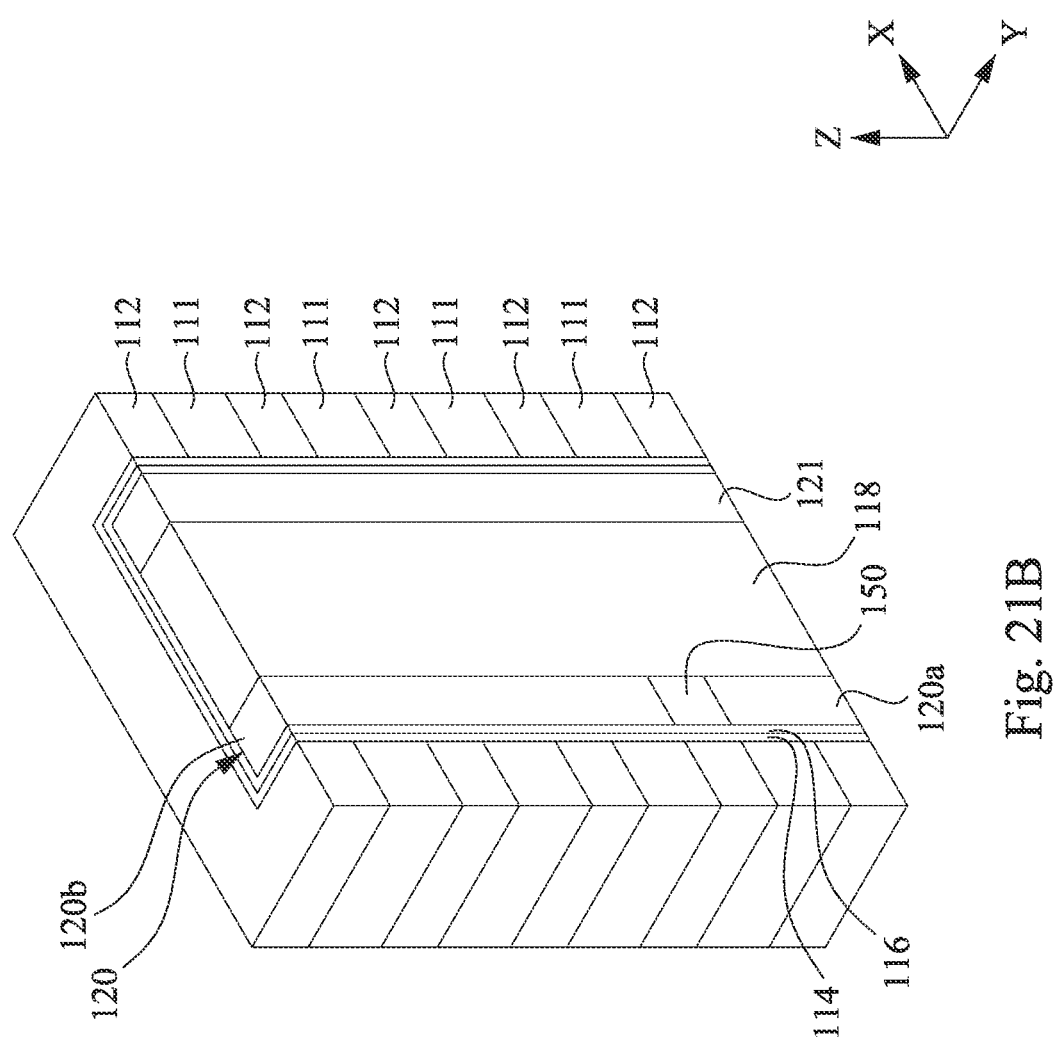

At operation 820, a drain structure (e.g., the drain structure 122) is formed in the first cavity. Corresponding to operation 820, FIGS. 21A, 22A, 23A, and 24A are top, perspective views of semiconductor die 900 at various stages of the forming the drain structure 122. Referring to FIG. 21A and FIG. 21B, which is a side cross-section view of a portion of the semiconductor die 900 indicated by the arrow H in FIG. 21A, to form the drain structure 122, a drain material 121 is deposited in the second cavity 134 so as to fill the second cavity 134. The drain material may include Al, Ti, TiN, TaN, Co, Ag, Au, Cu, Ni, Cr, Hf, Ru, W, Pt, WN, Ru, any other suitable material or a combination or alloy thereof, and may be deposited using any suitable method including, for example, molecular beam deposition (MBD), atomic layer deposition (ALD), chemical vapor deposition (CVD), plasma enhanced CVD (PECVD), metal organic CVD (MOCVD,) a high aspect ratio process (HARP), epitaxial growth, and the like. A CMP operation may be performed after depositing the drain material 121 to planarize the top surface of the semiconductor die 900.

Figure 22A:
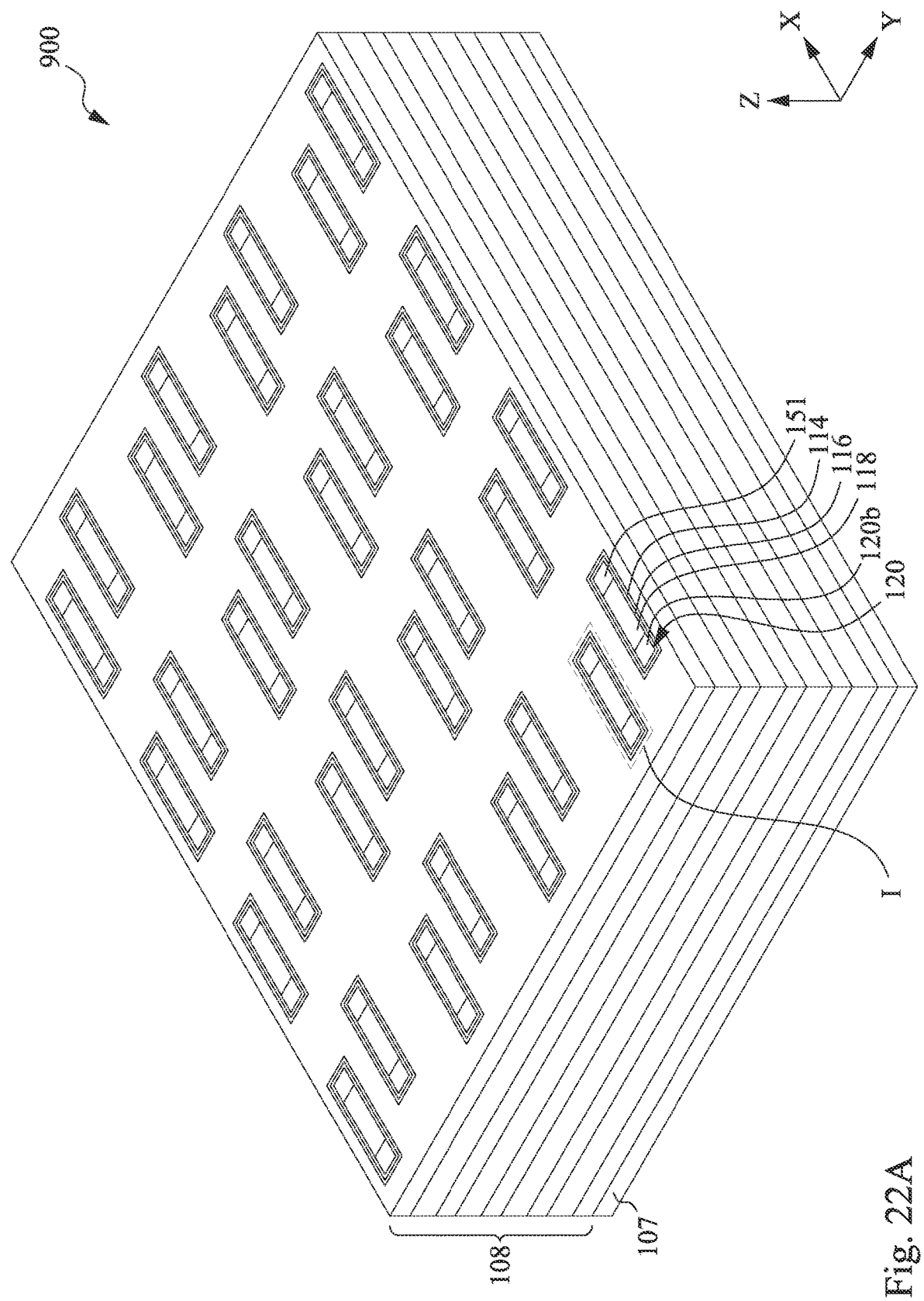
Figure 22B:
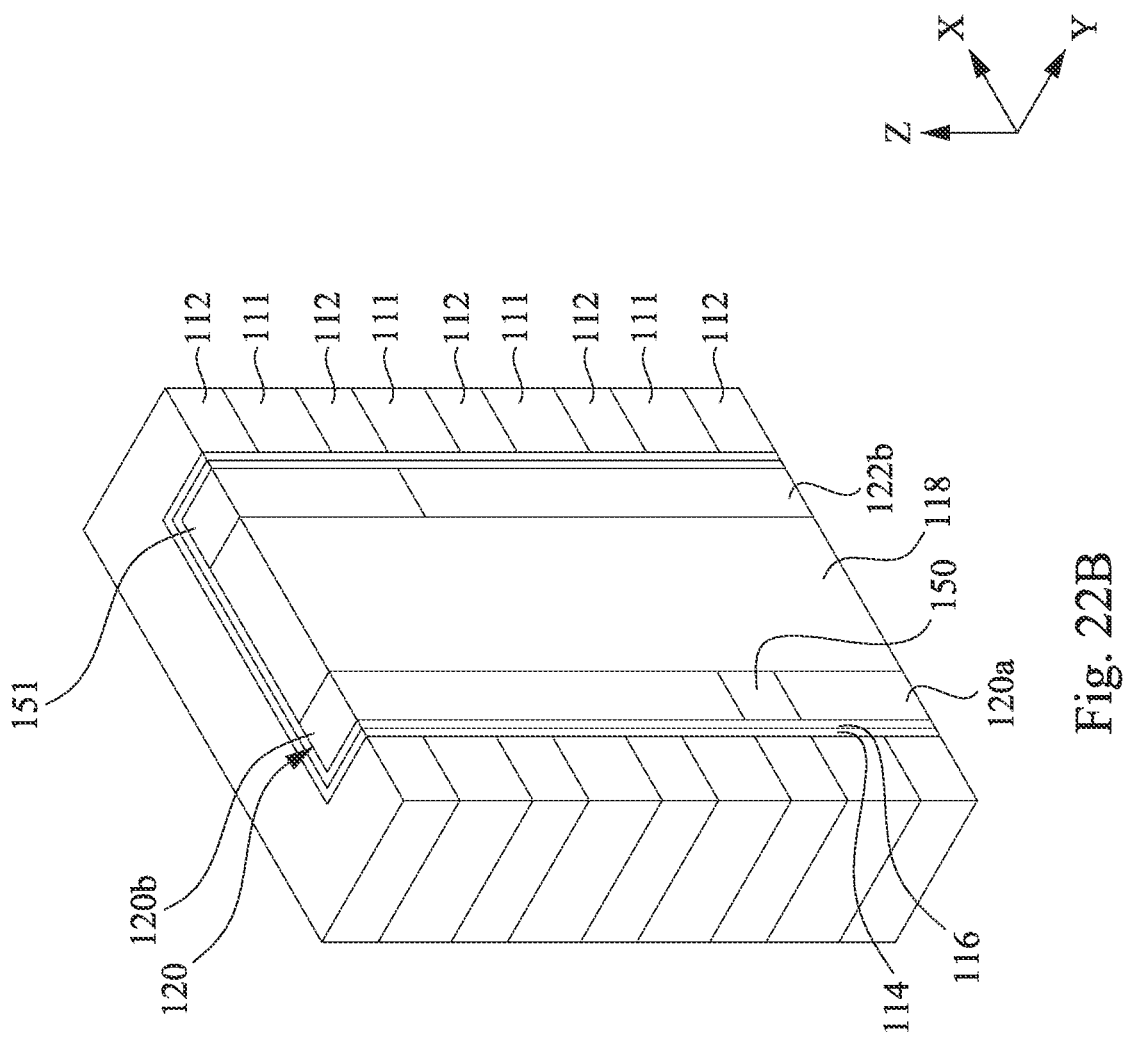

FIG. 22B is a side cross-section view of a portion of the semiconductor die 900 indicated by the arrow I in FIG. 22A. The drain material 121 is etched backed up to a predetermined thickness so as to form the inactive drain portion 122b, and a dielectric material 151 is subsequently deposited in the second cavity 134 above the inactive drain portion 122b until the second cavity 134 is filled with the dielectric material 151. The dielectric material 151 may be deposited using any suitable method including, for example, molecular beam epitaxy (MBE), atomic layer deposition (ALD), chemical vapor deposition (CVD), plasma enhanced CVD (PECVD), metal organic CVD (MOCVD,) a high aspect ratio process (HARP), epitaxial growth, and the like. A CMP operation may be performed after depositing the dielectric material 151 to planarize the top surface of the semiconductor die 900.

Figure 23A:
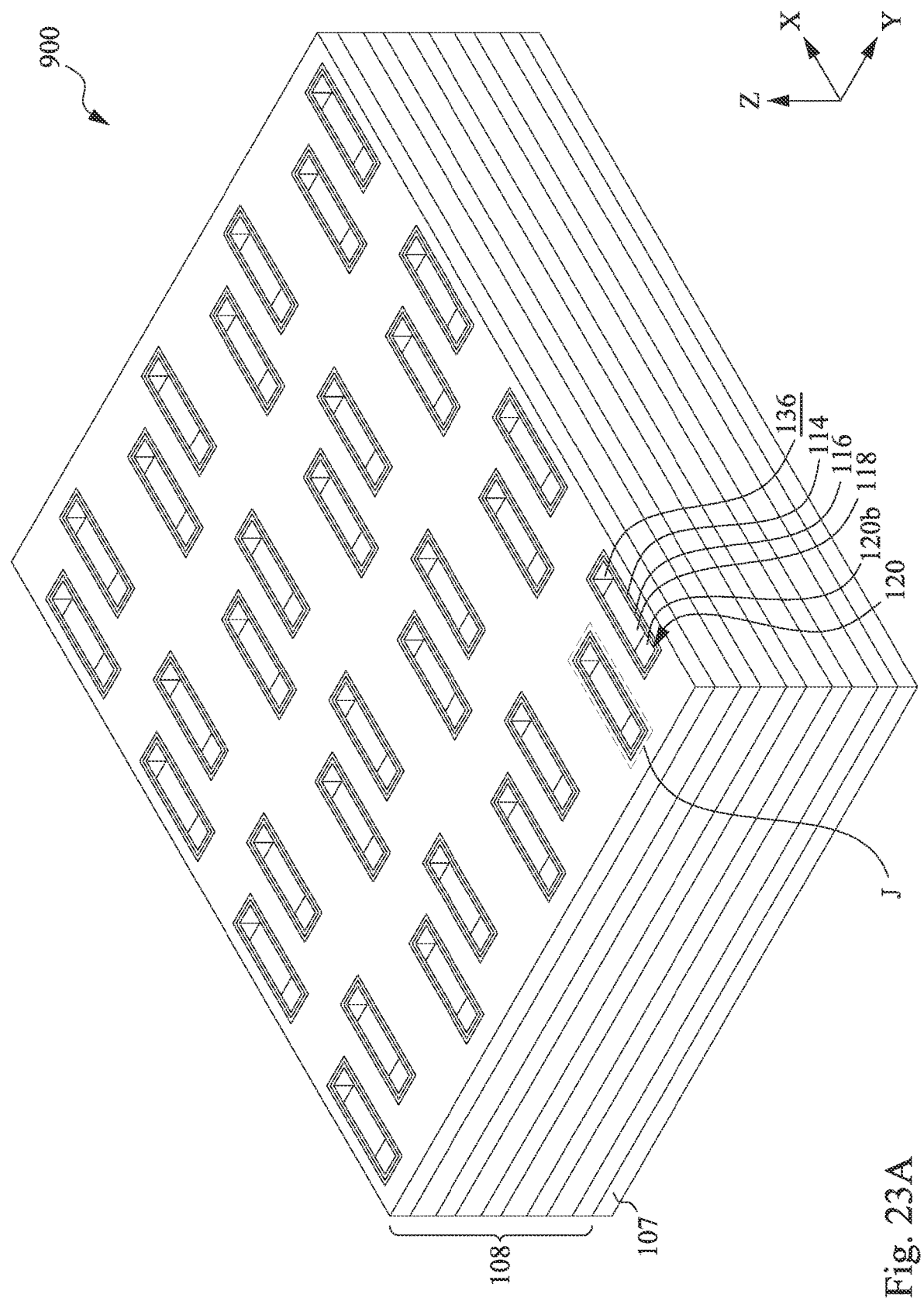
Figure 23B:
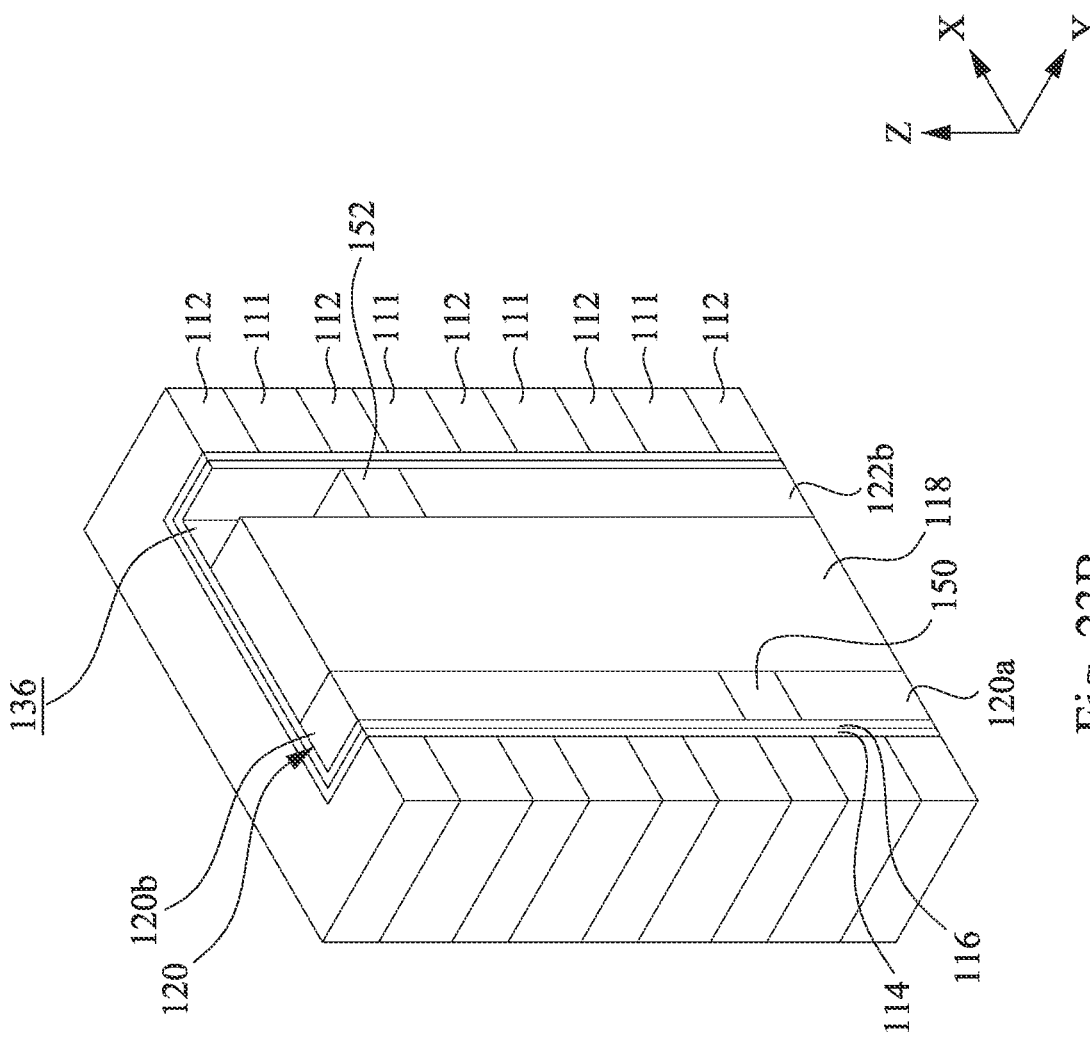

FIG. 23B is a side cross-section view of a portion of the semiconductor die 900 indicated by the arrow J in FIG. 23A. The dielectric material 151 is etched up to a predetermined thickness to form a second dielectric structure 152 such that a second void 136 is formed above the second dielectric structure 152. The drain material 121 and/or the dielectric material 151 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second void 136. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 24A:
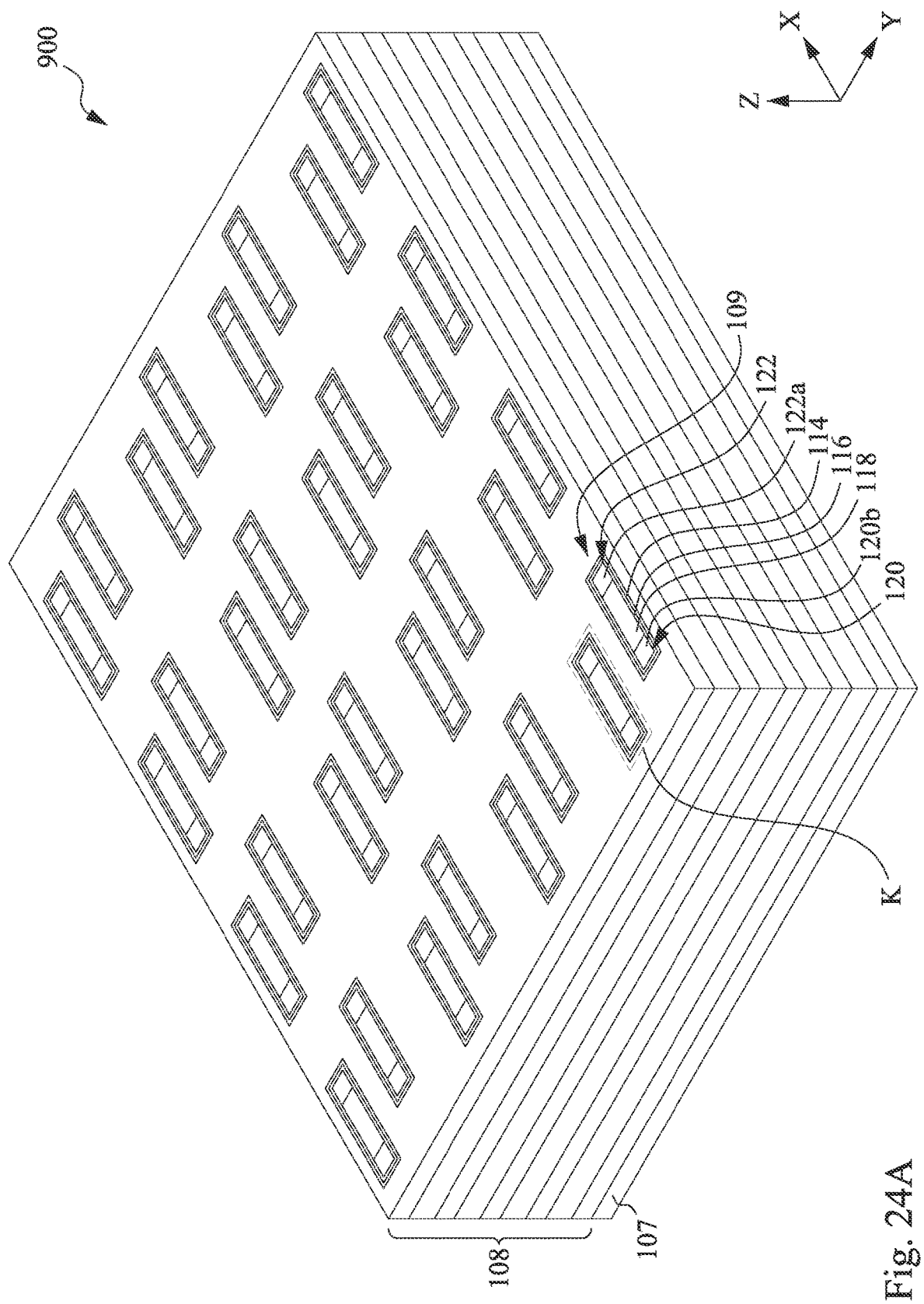
Figure 24B:
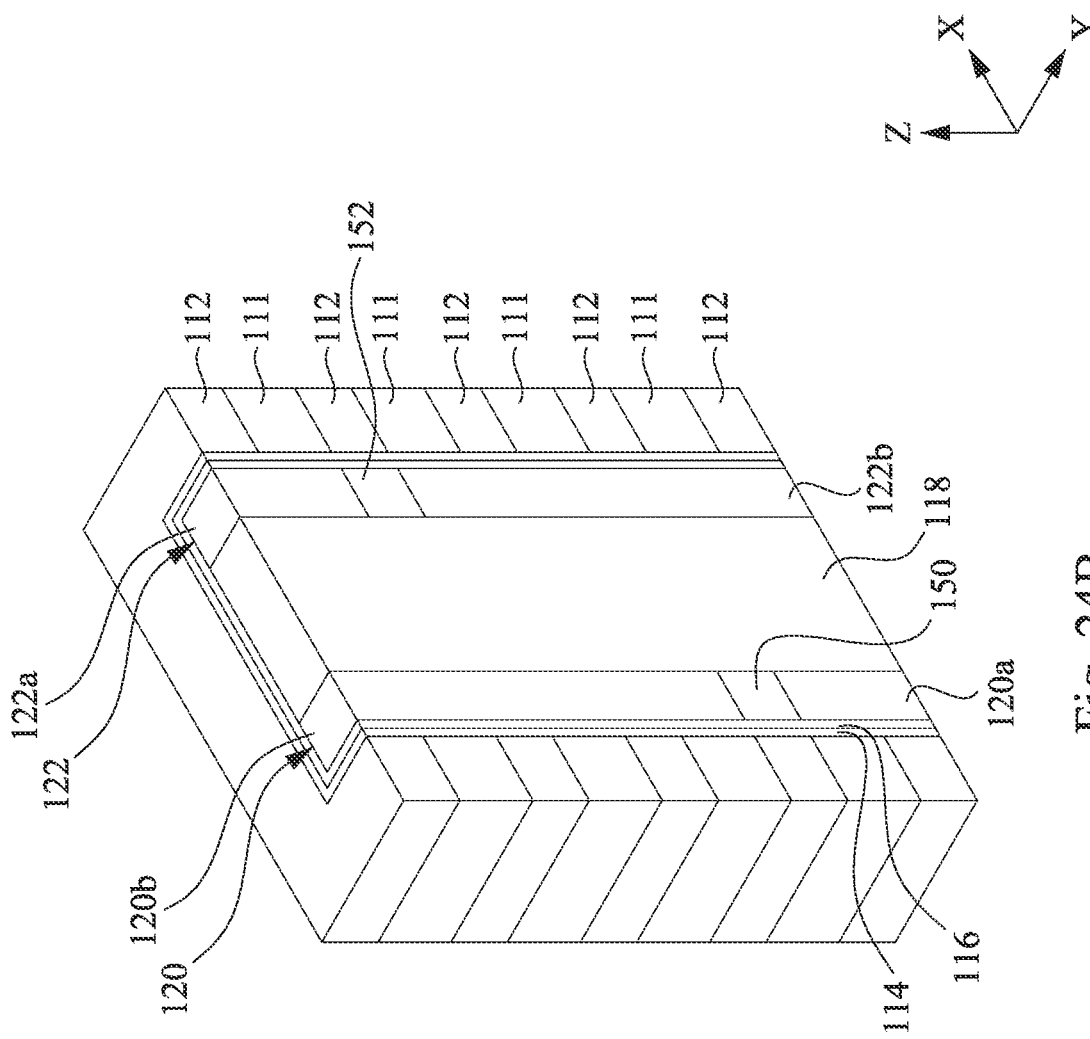

FIG. 24A is a top, perspective view of the semiconductor die 900 after forming the drain structure 122 such that an array of device structures 109 are formed in the semiconductor die 900. FIG. 24B is a side cross-section view of a portion of the semiconductor die 900 indicated by the arrow K in FIG. 24A. To form the drain structure 122, the second void 136 is completely filled with the source material to form the active drain portion 122a. The drain material for the active drain portion 122a may be deposited using any suitable method including, for example, molecular beam epitaxy (MBE), atomic layer deposition (ALD), chemical vapor deposition (CVD), plasma enhanced CVD (PECVD), metal organic CVD (MOCVD,) a high aspect ratio process (HARP), epitaxial growth, and the like. A CMP operation may be performed after forming the active drain portion to planarize the top surface of the semiconductor die 900.

Figure 25:
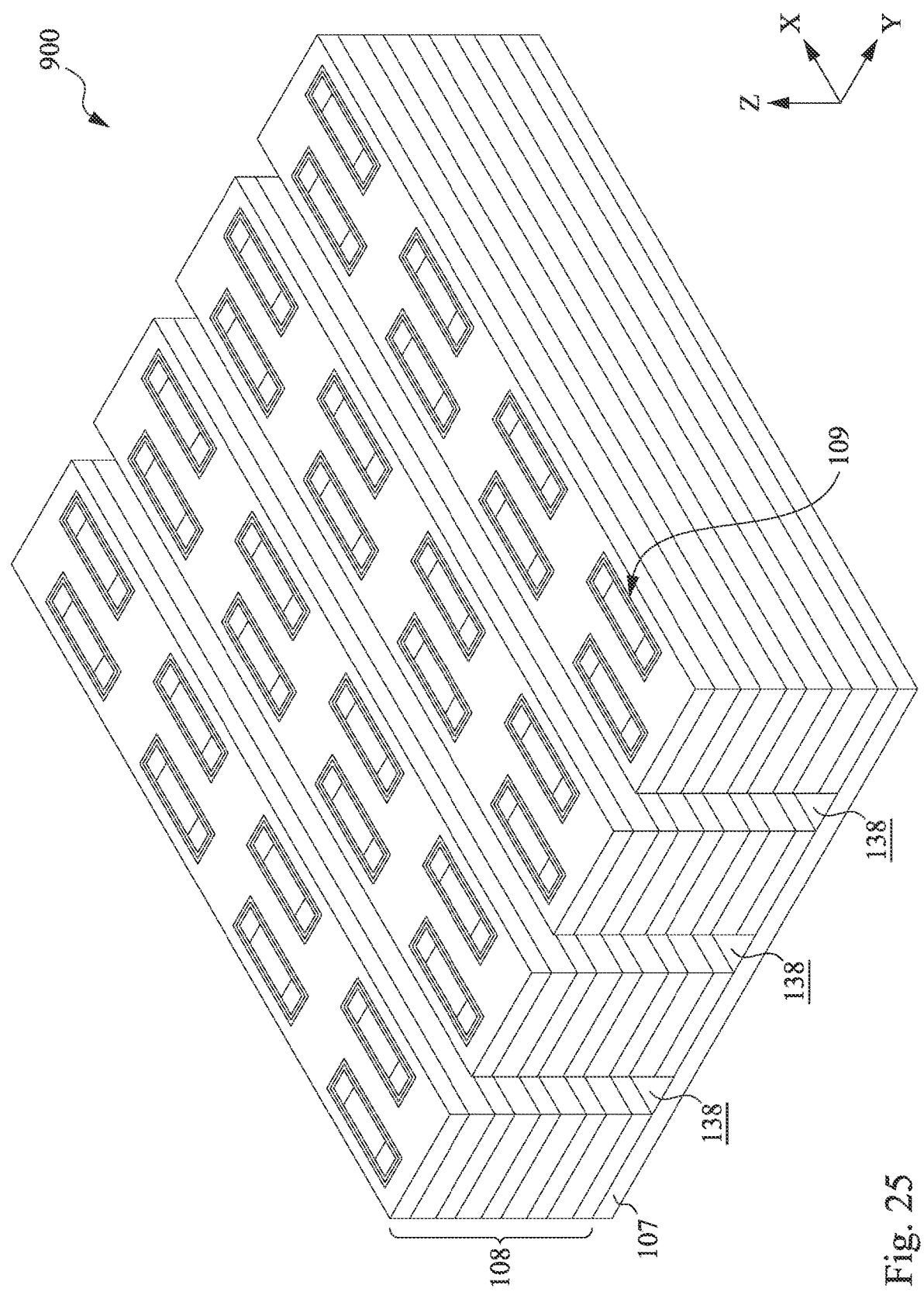

At operation 822, a plurality of trenches are formed through the stack in the first direction. Corresponding to operation 822, FIG. 25 is a top, perspective view of the semiconductor die 900 after forming a plurality of trenches 138 through the stack 108 in the Z-direction. Each of the trenches 138 extend along the X-direction between rows of device structures 109. The trenches 138 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the trenches 138. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process.

Figure 26A:
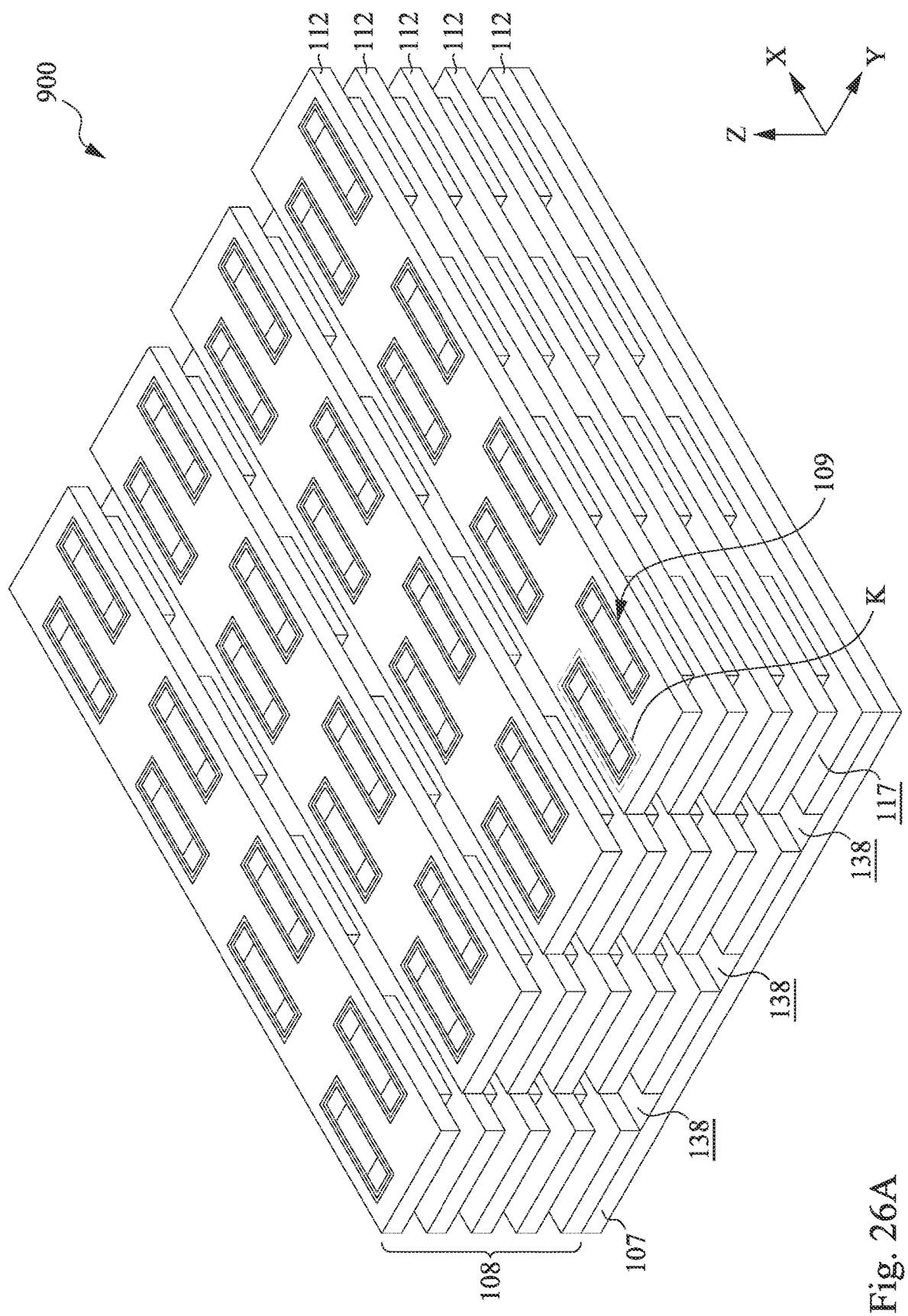
Figure 26B:
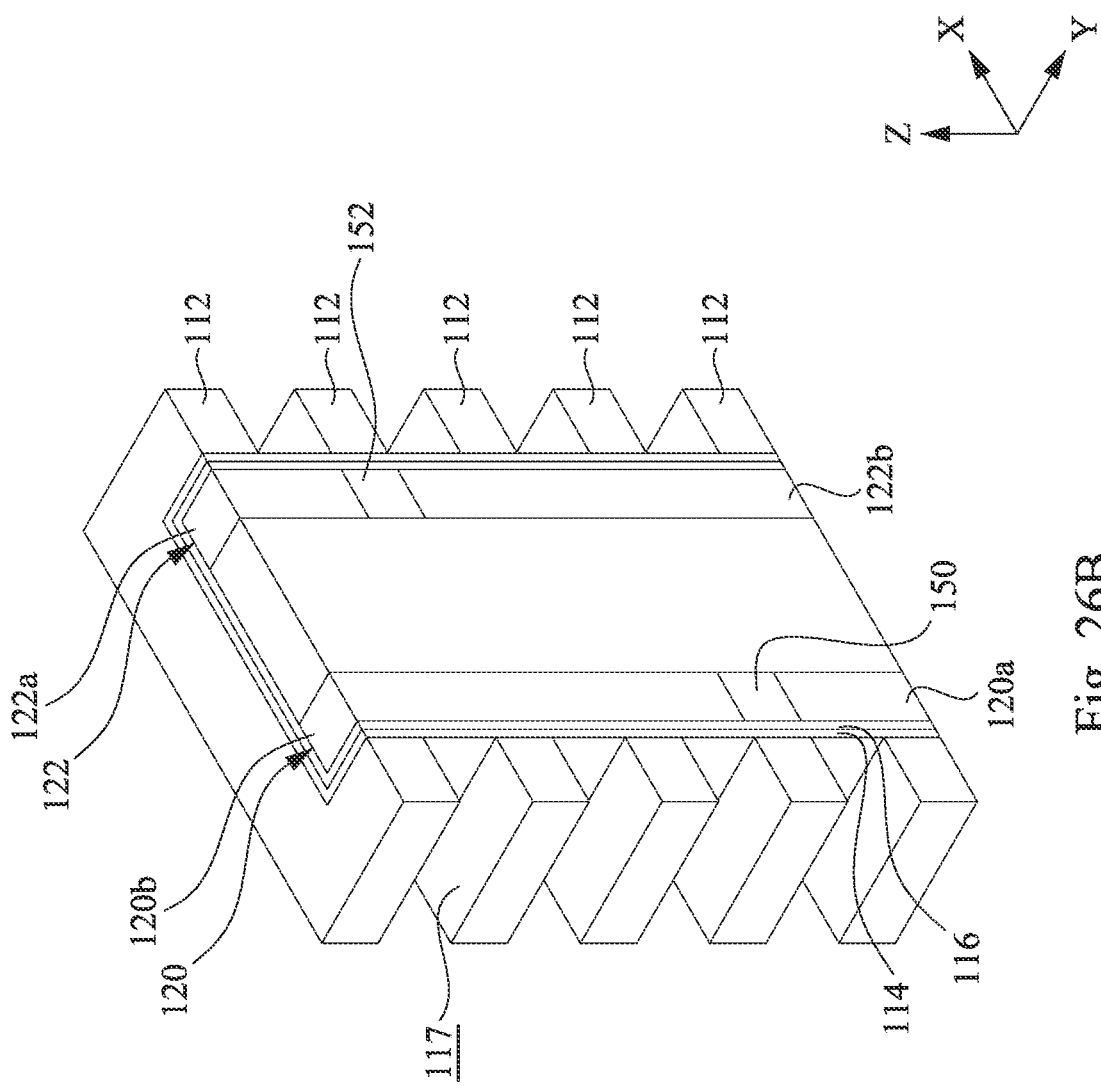
Figure 27A:
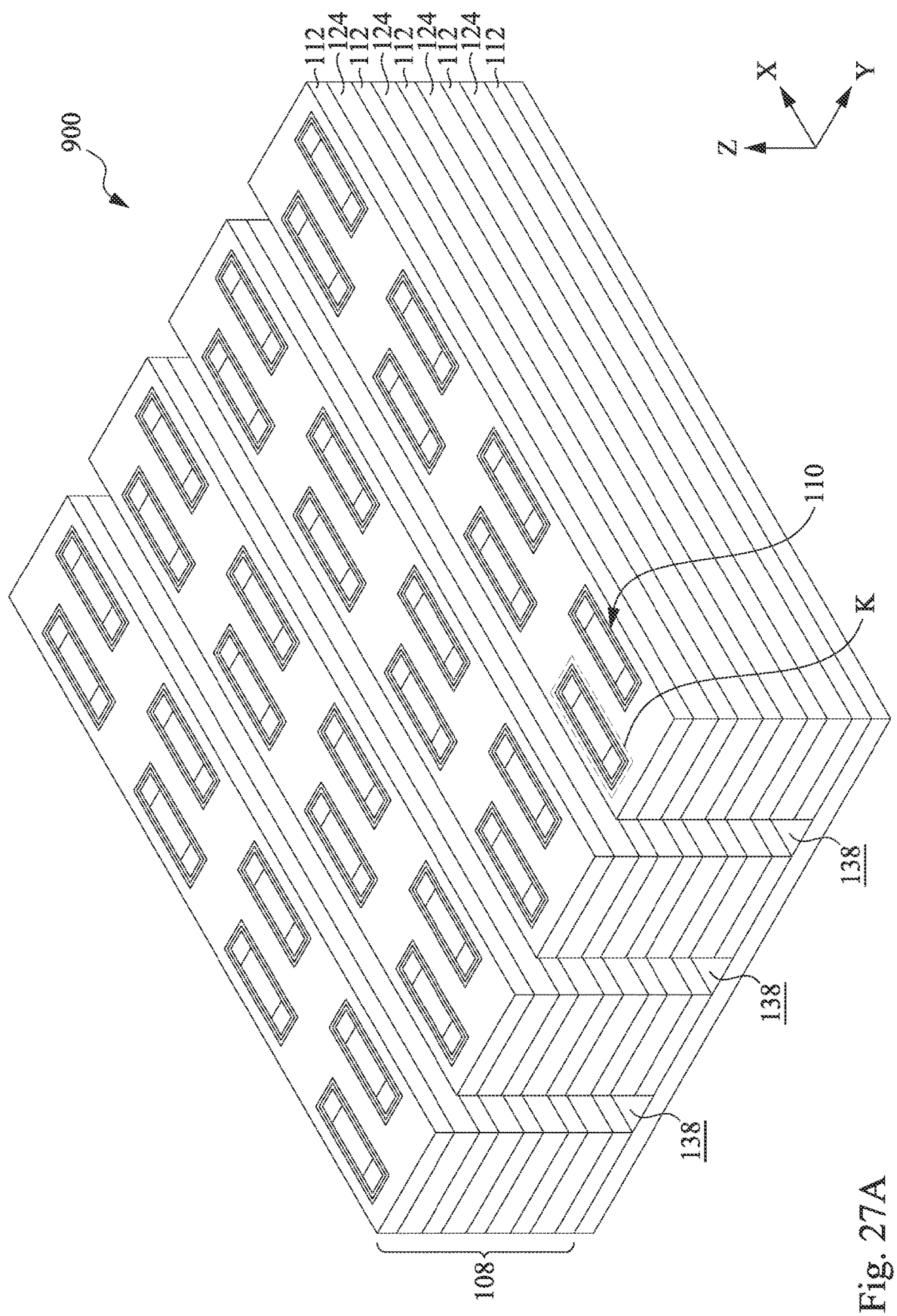

At operation 824, the sacrificial layers are replaced with gate layers. Corresponding to operation 824, FIGS. 26A and 27A are top, perspective views of the semiconductor die 900 at various stage of forming the gate layers 124. FIG. 26B is a side cross-section view of the semiconductor die 900 indicated by the arrow L in FIG. 26A. The exposed sacrificial layers 111 are etched until the sacrificial layers 111 are completely removed. In some embodiments, the sacrificial layers 111 may be etched using a wet etch process (e.g., hydrofluoric etch, buffered hydrofluoric acid, phosphoric acid, etc.). In other embodiments, the sacrificial layers 111 may be etched using a plasma etching process (including radical plasma etching, remote plasma etching, and other suitable plasma etching processes, ME, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process.

Etching the sacrificial layers 111 leaves cavities 117 between insulating layers 112 formed whose boundaries are formed by top and bottom surfaces of adjacent insulating layers 112 and an outer surface of the memory layers 114 of each device structure 109.

Figure 27B:
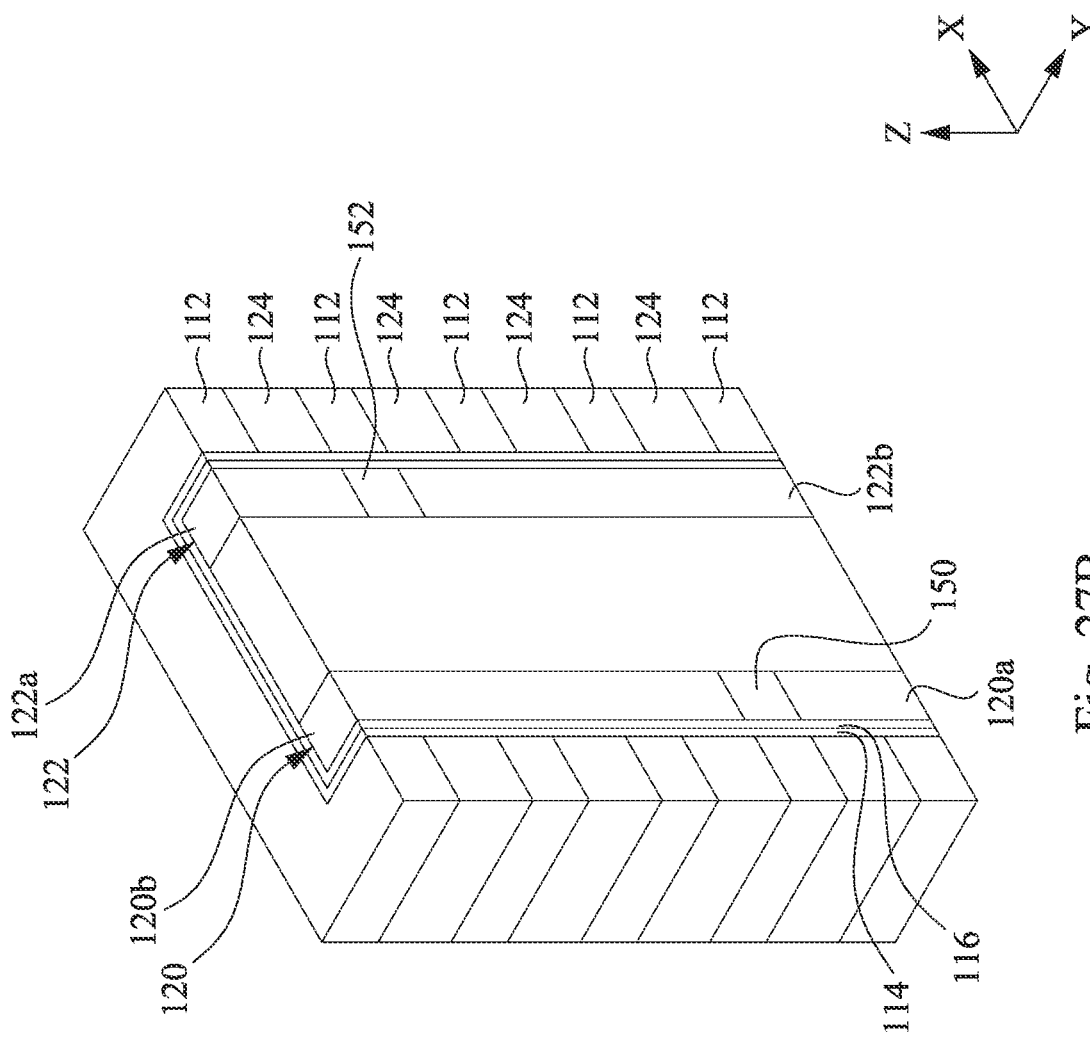

FIG. 27A is a top, perspective view of the semiconductor die 900, and FIG. 27B is a side cross-section view of a portion of the semiconductor die 900 indicated by the arrow K in FIG. 27A after forming the gate layers 124 so as to form the semiconductor devices 110. In some embodiments, an adhesive layer may be formed on exposed portions of sidewalls of the cavities 117 before depositing the gate layers 124 in the cavities 117. In various embodiments, the adhesive layers may include a material that has good adhesion with each of the insulating layers 112, the memory layer 114, and the gate layers 124, for example, Ti, Cr, TiN, WN, etc. The adhesive layers may be deposited using any suitable method including, for example, molecular beam deposition (MBD), atomic layer deposition (ALD), CVD, PECVD, MOCVD, epitaxial growth, and the like. In some embodiments, the adhesive layer 125 may have a thickness in a range of 0.1 nm to 5 nm, inclusive.

In various embodiments, the gate layers 124 are formed by depositing a gate dielectric and/or gate metal in the cavities 117 (e.g., over the adhesive layer), such that the gate layer 124 is continuous along the walls of each of the cavities 128, and on the top surface of the substrate 107. In various embodiments, the gate layer 124 may be formed from a high-k dielectric material. Although, each of gate layers 124 shown in FIGS. 27A-27B is shown as a single layer, in other embodiments, the gate layers 124 can be formed as a multi-layer stack (e.g., including a gate dielectric layer and a gate metal layer), while remaining within the scope of the present disclosure. The gate layers 124 may be formed of different high-k dielectric materials or a similar high-k dielectric material. Example high-k dielectric materials include a metal oxide or a silicate of Hf, Al, Zr, La, Mg, Ba, Ti, Pb, and combinations thereof (e.g., Al, Ti, TiN, TaN, Co, Ag, Au, Cu, Ni, Cr, Hf, Ru, W, Pt, WN, Ru, etc.). The gate layers 124 can be deposited using any suitable method, including, for example, molecular beam deposition (MBD), atomic layer deposition (ALD), CVD, PECVD, MOCVD, epitaxial growth, and the like.

In some embodiments, the gate layers 124 may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. In some embodiments, back etching may be performed to remove gate layer material disposed on the substrate 107 or on axially inner walls of the insulating layers 112.

Figure 28:
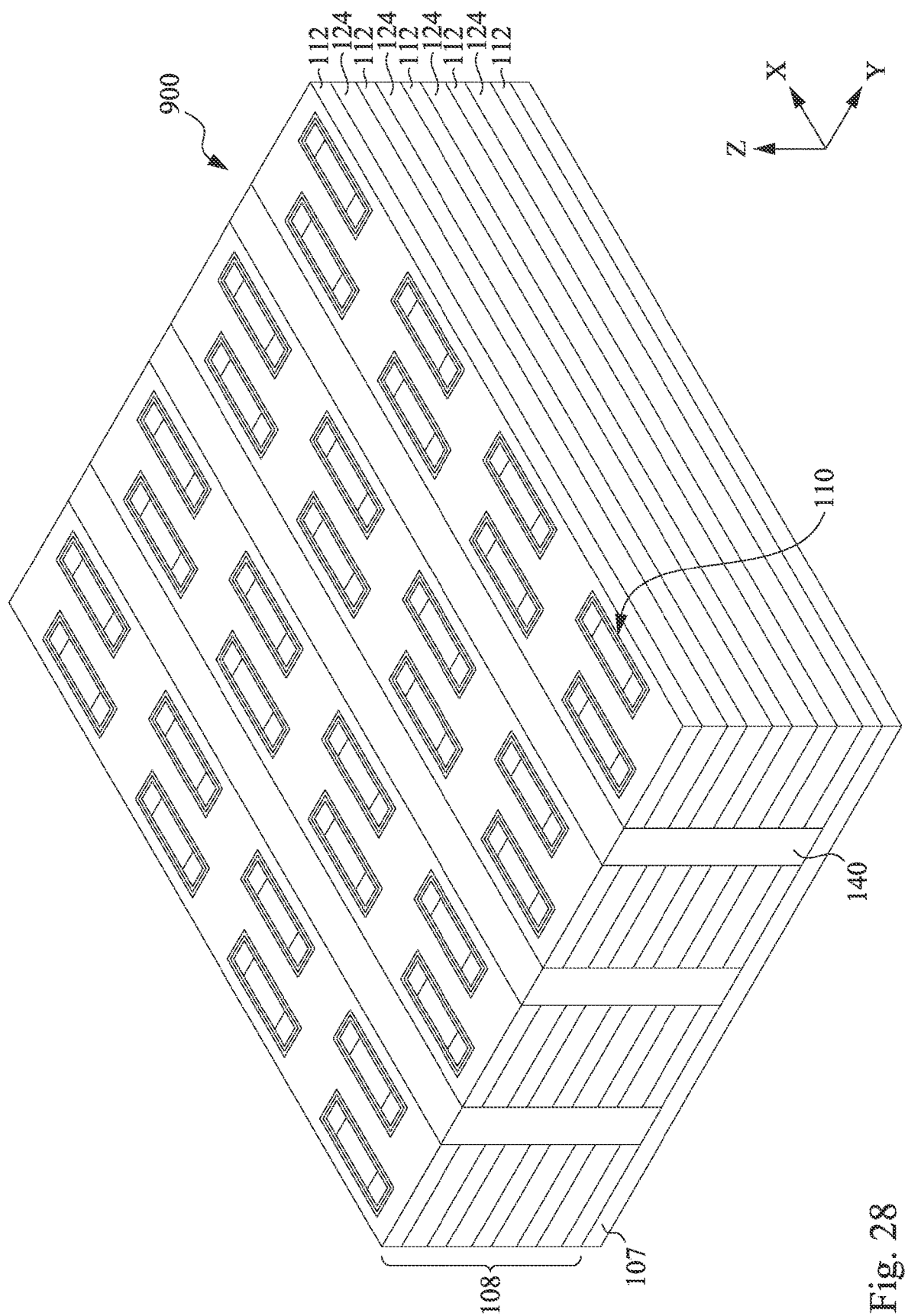

At operation 826, the plurality of trenches are filled with an insulating material to form the semiconductor die. Corresponding to operation 826, FIG. 28 is a top, perspective view of the semiconductor die 900 after the dielectric material 149 has been deposited in the trenches 138. The insulating material 140 may be deposited using any suitable method, for example, molecular beam deposition (MBD), atomic layer deposition (ALD), CVD, PECVD, MOCVD, epitaxial growth, and the like. The insulating material 140 may include $SiO_2$, SiON, SiN, SiCN, $HfO_2$, $TaO_x$, $TiO_x$, $AlO_x$, etc. In some embodiments, the insulating material 140 may be same as the material of the insulating layers 112. A CMP operation may be performed after filling the second set of first trenches with the insulating material 140 to planarize the top surface of the semiconductor die 900.

In some embodiments, a semiconductor device comprises: a source structure comprising an active source portion, an inactive source portion spaced apart from the active source portion in a vertical direction, and a first dielectric structure interposed between the active source portion and the inactive source portion; a drain structure spaced apart from the source structure in a first direction; a channel layer disposed on outer surfaces of the source structure and the drain structure; a memory layer disposed on an outer surface of the channel layer so as to wrap around the channel layer; and at least one gate layer in electrical communication with the active source portion.

In some embodiments, a semiconductor die comprises: an array of memory devices. Each memory device of the array of memory devices comprises: a source structure; a drain structure spaced apart from the source structure in a first direction; a channel layer disposed on outer surfaces of the source structure and the drain structure; a memory layer disposed on an outer surface of the channel layer so as to wrap around the channel layer; and a stack disposed on outer surfaces of the memory layer, the stack comprising a plurality of insulating layers and a plurality of gate layers alternatively stacked on top of each other in a vertical direction, and extending in the first direction. A dielectric structure is embedded within the source structure and/or the drain structure, the dielectric structure dividing the source structure and/or the drain structure into an active portion, and an inactive portion electrically isolated from the active portion.

In some embodiments, a method of making a semiconductor die, comprises: providing a stack comprising a plurality of insulating layers and a plurality of sacrificial layers alternatively stacked on top each other in a vertical direction; forming a plurality of cavities through the stack; forming a memory layer on walls of each of the plurality of cavities extending in the vertical direction; forming a channel layer on inner surfaces of the memory layer; forming a source structure and a drain structure axially separated apart from the source structure within the cavities such that a dielectric structure is embedded within the source structure and/or the drain structure, the dielectric structure dividing the source structure and/or the drain structure into an active portion, and an inactive portion electrically isolated from the active portion; and forming a plurality of gate layers by replacing the plurality of sacrificial layers so as to form an array of memory devices.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a source structure comprising an active source portion, an inactive source portion spaced apart from the active source portion in a vertical direction, and a first dielectric structure interposed between the active source portion and the inactive source portion;
   a drain structure spaced apart from the source structure in a first direction;
   a channel layer disposed on outer surfaces of the source structure and the drain structure;
   a memory layer disposed on an outer surface of the channel layer so as to wrap around the channel layer; and
   at least one gate layer in electrical communication with the active source portion, wherein the drain structure comprises an active drain portion, an inactive drain portion spaced apart from the active drain portion in a vertical direction, and a second dielectric structure interposed between the active drain portion and the inactive drain portion, and the at least one gate layer is in electrical communication with the active drain portion.

2. The semiconductor device of claim 1, wherein the active source portion is located proximate to a first surface of the semiconductor device in the vertical direction, and the active drain portion is located proximate to a second surface of the semiconductor device in the vertical direction opposite the first surface.

3. The semiconductor device of claim 1, wherein a thickness of each of the inactive source portion and the inactive drain portion is larger than a corresponding thickness of each of the active source portion and the active drain portion, respectively.

4. The semiconductor device of claim 1, wherein the at least one gate layer comprises:
   a first gate layer in electrical communication with the active source portion,
   a second gate layer in electrical communication with the active drain portion, and
   at least one third gate layer coupled to the inactive source portion and the inactive drain portion.

5. The semiconductor device of claim 4, wherein a thickness of at least one of the first gate layer and the second gate layer is larger than a thickness of the at least one third gate layer.

6. The semiconductor device of claim 1, wherein the at least one gate layer comprises:
   a plurality of first gate layers in electrical communication with the active source portion, and
   a plurality of second gate layers in electrical communication with the active drain portion.

7. The semiconductor device of claim 1, wherein:
   a thickness of the active source portion is larger than a thickness of the active drain portion,
   a plurality of first gate layers are in electrical communication with the active source portion, a second gate layer is in electrical communication with the active drain portion, and the at least one gate layer coupled to the inactive source portion and the inactive drain portion.

8. The semiconductor device of claim 1, wherein:

a thickness of the active drain portion is larger than a thickness of the active source portion, a first gate layer is in electrical communication with the active source portion, and a plurality of second gate layers are in electrical communication with the active drain portion.

9. The semiconductor device of claim 1, wherein the semiconductor device has a rectangular shape, a square shape, an oval shape, an elliptical shape, or a circular shape in an X-Y plane.

10. The semiconductor device of claim 9, wherein axial ends of each of the plurality of semiconductor devices are rounded.

11. The semiconductor device of claim 1, wherein the memory layer comprises a ferroelectric material selected from the group consisting of lead zirconate titanate (PZT), PbZr/TiO3, BaTiO3, PbTiO2, HfO2, Hr1-xZrxO2, $ZrO_2$, TiO2, NiO, TaOx, Cu2O, Nb2O5, and AlOx.

12. The semiconductor device of claim 1, wherein the first dielectric structure has a thickness in a range of 5 nm to 50 nm, and wherein a ratio of thickness of the first dielectric structure to a thickness of the active source portion is in a range of 1:2 to 1:10.

13. The semiconductor device of claim 1, wherein the source structure and drain structure comprise a conducting material selected from the group consisting of aluminum (Al), titanium (Ti), titanium nitride (TiN), tantalum nitride (TaN), cobalt (Co), silver (Ag), gold (Au), copper (Cu), nickel (Ni), chromium (Cr), hafnium (Hf), ruthenium (Ru), tungsten (W), platinum (Pt), tungsten nitride (WN), and combinations thereof.

14. A semiconductor die, comprising:

an array of memory devices, each memory device of the array of memory devices comprising:

a source structure;

a drain structure spaced apart from the source structure in a first direction;

a channel layer disposed on outer surfaces of the source structure and the drain structure;

a memory layer disposed on an outer surface of the channel layer so as to wrap around the channel layer; and a stack disposed on outer surfaces of the memory layer, the stack comprising a plurality of insulating layers and a plurality of gate layers alternatively stacked on top of each other in a vertical direction, and extending in the first direction, wherein a dielectric structure is embedded within the source structure and/or the drain structure, the dielectric structure dividing the source structure and/or the drain structure into an active portion, and an inactive portion electrically isolated from the active portion, wherein a thickness of the inactive portion of the source and the inactive portion of the drain is larger than a corresponding thickness of each of the active portion of the source and the inactive portion of the source, respectively.

15. The semiconductor die of claim 14, wherein each of the memory devices has a rectangular shape, a square shape, an oval shape, an elliptical shape, or a circular shape in an X-Y plane.

16. The semiconductor die of claim 14, wherein axial ends of each of the plurality of memory devices are rounded.

17. The semiconductor die of claim 14, wherein the active portion of the source structure is located proximate to a first surface of the semiconductor die in the vertical direction, and the active portion of the drain structure is located proximate to a second surface of the semiconductor device in the vertical direction opposite the first surface.

18. The semiconductor die of claim 14, wherein the channel layer wraps around the source structure and the drain structure and comprises a semiconductor material selected from the group consisting of silicon, germanium, silicon germanium, silicon carbide, indium gallium zinc oxide (IGZO), indium tin oxide (ITO), zinc oxide (ZnO), and indium tungsten oxide (IWO).

19. The semiconductor die of claim 14, wherein an adhesive layer is disposed between the insulating layers, the memory layer, and the gate layers, the adhesive layer comprising a material selected from the group consisting of titanium (Ti), chromium (Cr), titanium nitride (TiN), tungsten nitride (WN), and combinations thereof.

20. The semiconductor die of claim 14, wherein the gate layers comprise a high-k dielectric material selected from the group consisting of metal oxides and silicates of hafnium (Hf), aluminum (Al), zirconium (Zr), lanthanum (La), magnesium (Mg), barium (Ba), titanium (Ti), lead (Pb), and combinations thereof.

* * * * *